(12) United States Patent
Lin et al.

(10) Patent No.: US 9,237,055 B2
(45) Date of Patent: Jan. 12, 2016

(54) ZIGBEE RECEIVER EXPLOITING AN RF-TO-BB CURRENT-REUSE BLIXER AND HYBRID FILTER TOPOLOGY

(71) Applicant: UNIVERSITY OF MACAU, Taipa, Macau (CN)

(72) Inventors: Zhicheng Lin, Macau (CN); Pui-In Mak, Macau (CN); Rui Paulo da Silva Martins, Macau (CN)

(73) Assignee: University of Macau, Taipa, Macau (CN)

( * ) Notice: Subject to any disclaimer, the term of this patent is extended or adjusted under 35 U.S.C. 154(b) by 0 days.

(21) Appl. No.: 14/254,318

(22) Filed: Apr. 16, 2014

(65) Prior Publication Data

US 2015/0304155 A1  Oct. 22, 2015

(51) Int. Cl.
| | |
|---|---|
| H04L 27/00 | (2006.01) |
| H04L 27/38 | (2006.01) |
| H04B 1/12 | (2006.01) |
| H04L 27/34 | (2006.01) |

(52) U.S. Cl.
CPC ............ *H04L 27/3809* (2013.01); *H04B 1/123* (2013.01); *H04L 27/3405* (2013.01)

(58) Field of Classification Search
CPC ................. H03D 2200/0023; H03F 2200/294; H03F 2200/06; H03F 2200/09
USPC .......................................... 375/316; 330/301
See application file for complete search history.

(56) References Cited

U.S. PATENT DOCUMENTS

| | | | |
|---|---|---|---|
| 8,934,577 B1 * | 1/2015 | Venkatesh et al. ............ | 375/319 |
| 2009/0310524 A1 * | 12/2009 | Katsube et al. ............... | 370/311 |
| 2011/0007845 A1 * | 1/2011 | Chen et al. ..................... | 375/319 |

OTHER PUBLICATIONS

P. Choi, H. Park, S. Kim, S. Park, I. Nam, T. W. Kim, S. Park, S. Shin, M. S. Kim, K. Kang, Y. Ku, H. Choi, S. M. Park, and K. Lee, "An Experimental Coin-Sized Radio for Extremely Low-Power WPAN(IEEE 802.15.4) Application at 2.4GHz," IEEE J. of Solid-State Circuits, vol. 38, pp. 2258-2268, Dec. 2003.

C.-H. Li, Y.-L. Liu, and C.-N. Kuo, "A 0.6-V 0.33-mW 5.5-GHz Receiver Front-End Using Resonator Coupling Technique" IEEE Trans. Microw. Theory Tech., vol. 59, No. 6, pp. 1629-1638, Jun. 2011.

B. W. Cook, A. Berny, A. Molnar, S. Lanzisera, and K. Pister, "Low-Power, 2.4-GHz Transceiver with Passive RX Front-End and 400-mV Supply," IEEE J. of Solid-State Circuits, vol. 41, pp. 2767-2775, Dec. 2006.

A. C. Herberg, T. W. Brown, T. S. Fiez, and K. Mayaram, "A 250-mV, 352-?W GPS Receiver RF Front-End in 130-nm CMOS," IEEE J. of Solid-State Circuits, vol. 46, pp. 938-949, Apr. 2011.

(Continued)

*Primary Examiner* — Kevin Kim
(74) *Attorney, Agent, or Firm* — Nath, Goldberg & Meyer; Stanley N. Protigal; Jerald L. Meyer

(57) ABSTRACT

A unified balun low noise amplifier (LNA) and I/Q mixer is provided as a single-chip design, and includes a passive/active gain-boosted balun-LNA-I/Q-mixer (blixer), a filter section and a buffer amplifier. The filter section includes an IF-noise-shaping transistorized current-mode lowpass filter sharing a common power supply with the blixer, which allows the blixer and lowpass filter to draw a single bias current. The filter section also includes a complex-pole load providing image rejection and channel selection.

13 Claims, 13 Drawing Sheets

(56) References Cited

OTHER PUBLICATIONS

F. Zhang, K. Wang, J. Koo, Y. Miyahara, and B. Otis, "A 1.6 mW 300 mV Supply 2.4 GHz Receiver with -94 dBm Sensitivity for Energy-Harvesting Applications," ISSCC Dig. Tech. Papers, pp. 456-457, Feb. 2013.

S. Blaakmeer, E. Klumperink, D. Leenaerts, and B. Nauta, "The Blixer, a Wideband Balun-LNA-I/Q-Mixer Topology," IEEE J. Solid-State Circuits, vol. 43, pp. 2706-2715, Dec. 2008.

A. Liscidini, M. Tedeschi, and R. Castello, "Low-Power Quadrature Receivers for ZigBee (IEEE 802.15.4) Applications," IEEE J. of Solid-State Circuits, vol. 45, pp. 1710-1719, Sep. 2010.

K.-W. Cheng, K. Natarajan, and D. Allstot, "A Current Reuse Quadrature GPS Receiver in 0.13 μm CMOS," IEEE J. of Solid-State Circuits, vol. 45, pp. 510-523, Mar. 2010.

D. Ghosh and R. Gharpurey, "A Power-Efficient Receiver Architecture Employing Bias-Current-Shared RF and Baseband With Merged Supply Voltage Domains and 1/f Noise Reduction," IEEE J. Solid-State Circuits, vol. 47, pp. 381-391, Feb. 2012.

Z. Lin, P.-I. Mak, and R. P. Martins, "A 1.7mW 0.22mm2 2.4GHz ZigBee RX Exploiting a Current-Reuse Blixer + Hybrid Filter Toploly in 65nm CMOS," ISSCC Dig. Tech. Papers, pp. 448-449, Feb. 2013.

S. Blaakmeer, E. Klumperink, D. Leenaerts, and B. Nauta, "Wideband balun-LNA with Simultaneous Output Balancing, Noise-Canceling and Distortion-Canceling," IEEE J. of Solid-State Circuits, vol. 43, pp. 1341-1350, Jun. 2008.

P.-I. Mak and R. P. Martins, "A 0.46-mm2 4-dB NF Unified Receiver Front-End for Full-Band Mobile TV in 65-nm CMOS," IEEE J. of Solid-State Circuits, vol. 46, pp. 1970-1984, Sep. 2011.

F. Bruccoleri, E. Klumperink, and B. Nauta, "Wide-band CMOS Low-Noise Amplifier Exploiting Thermal Noise Canceling," IEEE J. of Solid-State Circuits, vol. 39, pp. 275-282, Feb. 2004.

A. Pirola, A. Liscidini, and R. Castello, "Current-Mode, WCDMA Channel Filter With In-Band Noise Shaping," IEEE J. Solid-State Circuits, vol. 45, pp. 1770-1780, Sep. 2010.

C. L. Ler, A. K. A'ain and A. V. Kordesh "CMOS Source Degenerated Differential Active Inductor," IET Electronics Letters, vol. 44, pp. 196-197, Jan. 2008.

Y. Chen, P.-I. Mak, L. Zhang, and Y. Wang "A 0.07mm2, 2mW, 75MHz-IF, 4th-Order BPF Using a Source-Follower-Based Resonator in 90nm CMOS," IET Electronics Letters, vol. 48, pp. 552-554, May 2012.

J. Kaykovuori, K. Stadius, and J. Ryynanen, "Analysis and Design of Passive Polyphase Filters," IEEE Trans. Circuits Syst. I, Reg. Papers, vol. 55, pp. 3023-3037, Nov. 2008.

F. Behbahani, Y. Kishigami, J. Leete, A. A. Abidi, "CMOS Mixers and Polyphase Filters for Large Image Rejection," IEEE J. of Solid-State Circuits, vol. 36, pp. 873-887, Sep. 2001.

M. Camus, B. Butaye, L. Garcia, M. Sie, B. Pellat, and T. Parra, "A 5.4mW/0.007mm2 2.4GHz Front-End Receiver in 90nm CMOS for IEEE 802.15.4 WPAN Standard," IEEE J. Solid-State Circuits, vol. 43, pp. 1372-1383, Jun. 2008.

B. Razavi, K. F. Lee, and R. H. Yan, "Design of High-Speed, Low-Power Frequency Dividers and Phase-Locked Loops in Deep Submicron CMOS," IEEE J. Solid-State Circuits, vol. 30, pp. 101-109, Feb. 1995.

A. Liscidini, M. Tedeschi, and R. Castello, "A 2.4GHz 3.6mW 0.35mm2 Quadrature Front-End RX for ZigBee and WPAN Applications," ISSCC Dig. Tech. Papers, pp. 370-371, Feb. 2008.

A. Balankutty, S. A. Yu, Y. Feng, and P. Kinget, "A 0.6V Zero-IF/ Low-IF Receiver with Integrated Fractional-N Synthesizer for 2.4GHz ISM-Band Applications," IEEE J. of Solid-State Circuits, vol. 45, pp. 538-553, Mar. 2010.

Z. Lin, P.-I. Mak, and R. P. Martins, "A 2.4 GHz ZigBee Receiver Exploiting an RF-to-BB-Current-Reuse Blixer + Hybrid Filter Topology in 65 nm CMOS," IEEE J. of Solid-State Circuits, vol. PP, pp. 1-13, Mar. 2014.

* cited by examiner

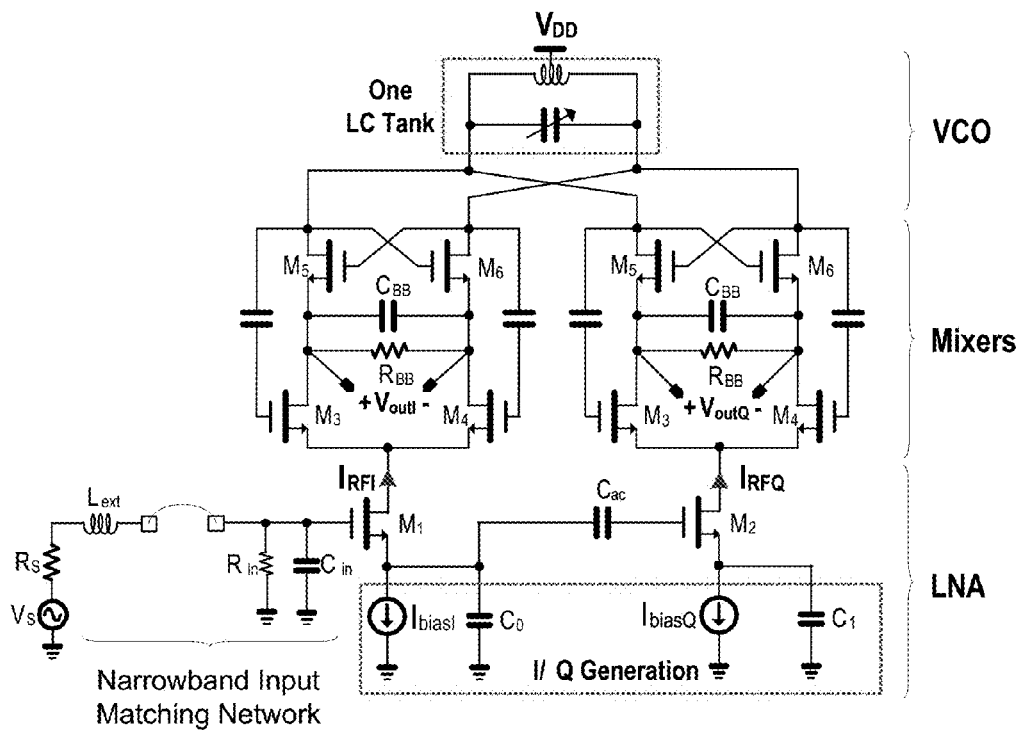
Fig. 1
*(related art)*
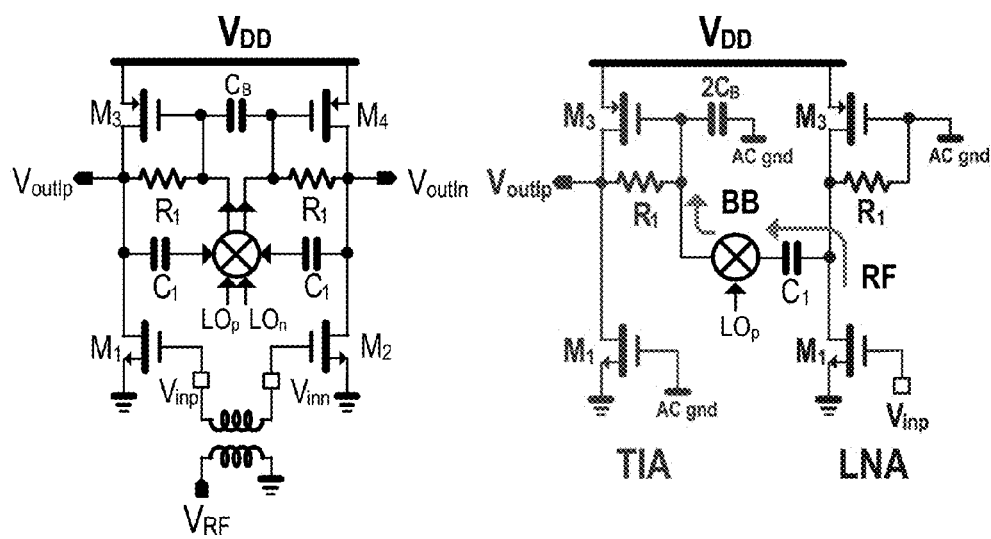
Fig. 2A
*(related art)*
Fig. 2B
*(related art)*

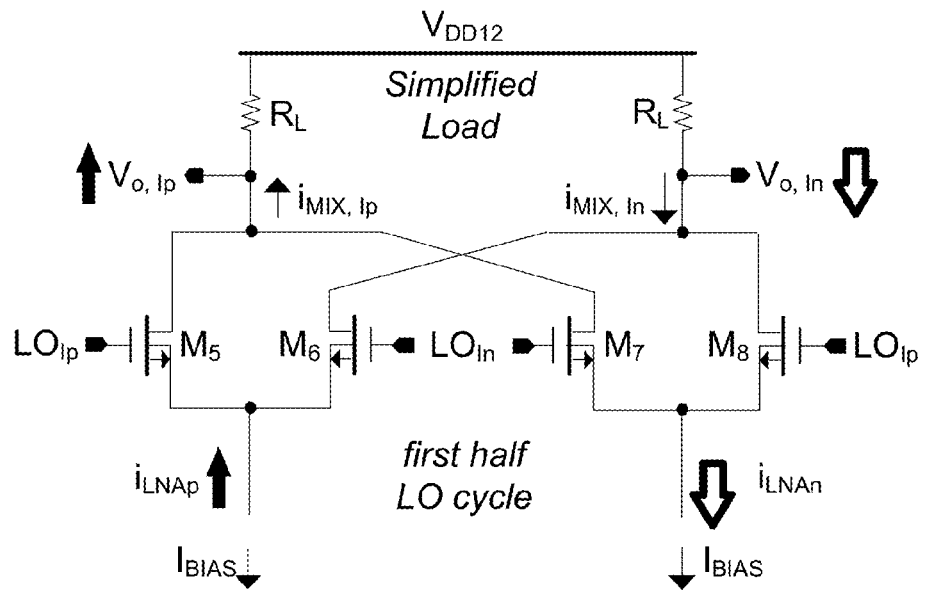
Fig. 5A
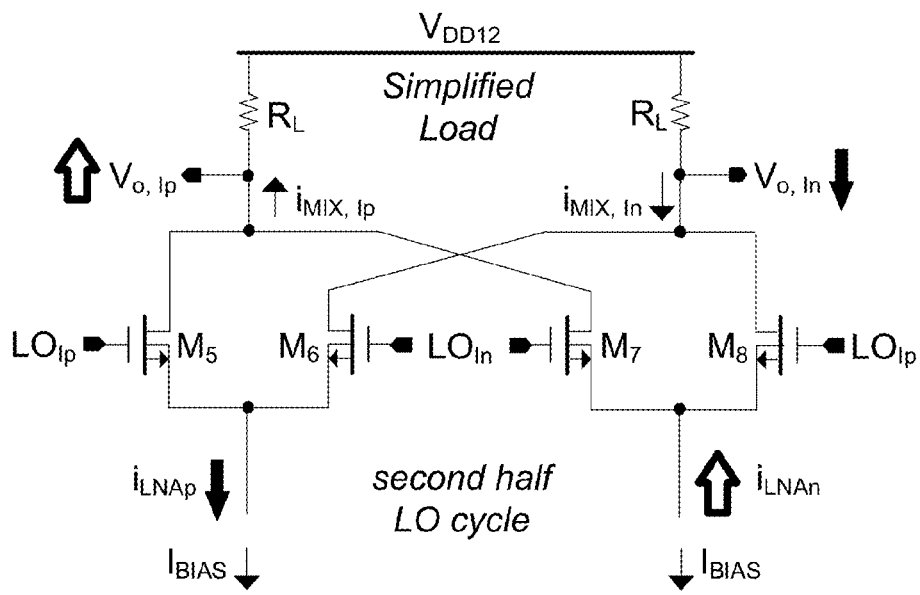
Fig. 5B
Fig. 5C

For $R_{sf} \gg sL_{act}$
A: $\omega \leq 0.1\omega_{or}$ → $Z_p \approx sL_{act}$
B: $0.1\omega_{or} < \omega < \omega_{or}$ → $Z_p \approx \dfrac{sL_{act}}{1 + s^2 L_{act} C_{f1}}$
C: $\omega = \omega_{or}$ → $Z_p = R_{sf}$
D: $\omega_{or} < \omega < 10\omega_{or}$ → $Z_p \approx \dfrac{sL_{act}}{1 + s^2 L_{act} C_{f1}}$
E: $\omega \geq 10\omega_{or}$ → $Z_p \approx \dfrac{1}{sC_{f1}}$
*Fig. 7A*
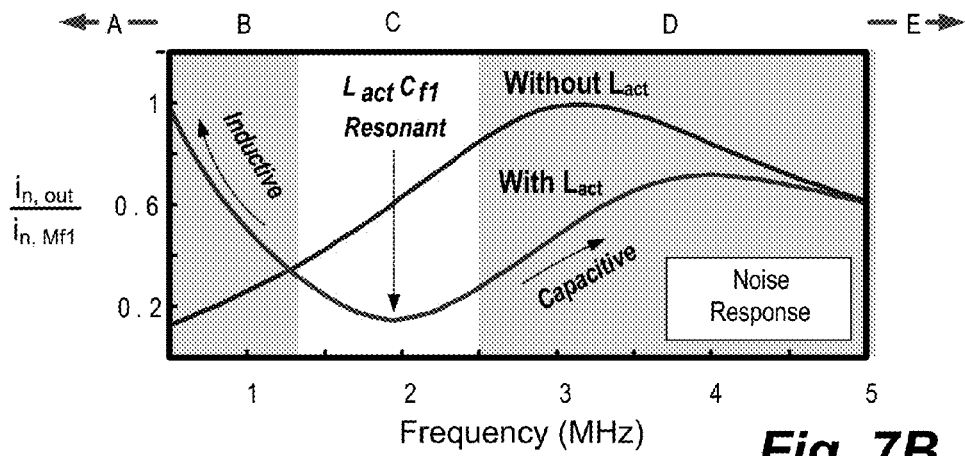
*Fig. 7B*
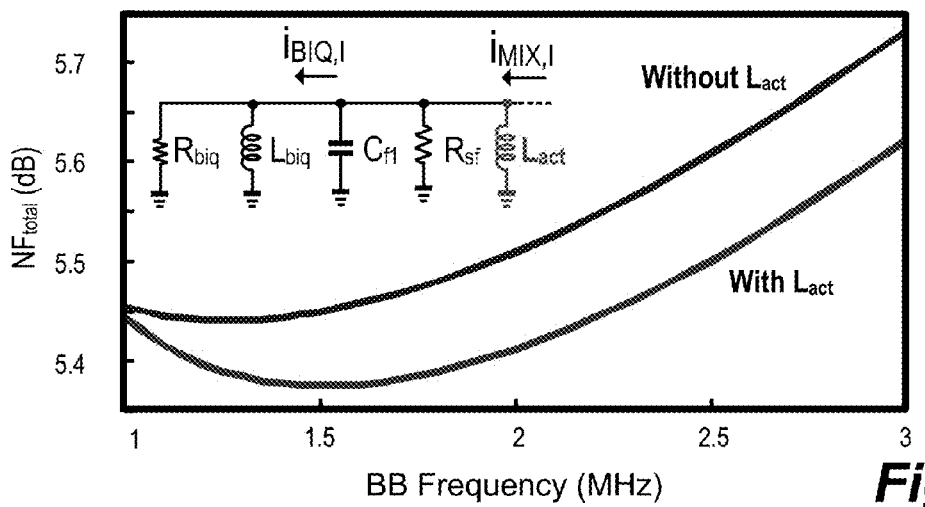
*Fig. 8*

$$\frac{V_{o,I}}{i_{rLPF,I}} = \underbrace{\frac{R_L}{1 + sR_L C_L - jg_{m,Mc} R_L}}_{Complex-Pole\ Load}$$

ZIGBEE RECEIVER EXPLOITING AN RF-TO-BB CURRENT-REUSE BLIXER AND HYBRID FILTER TOPOLOGY

BACKGROUND

1. Field

The present disclosure relates to radio frequency (RF) signal interface circuits, and particularly to baluns, mixers and filters providing a combined function of a balun, low noise amplifier (LNA), and an I/Q mixer, referred to as a blixer, and also providing a baseband (BB) hybrid filter.

2. Background

Ultra-low-power (ULP) radios have essentially underpinned the development of short-range wireless technologies such as personal/body area networks and Internet of Things. The main challenges faced by those ULP radios are the stringent power and area budgets, and the pressure of minimum external components to save cost and system volume. Balancing them with the performance metrics such as noise figure (NF), linearity and input matching involves many design tradeoffs at both architecture and circuit levels.

Ultra-low-voltage receivers have been extensively studied for short-range ZigBee, Bluetooth and energy-harvesting applications. Yet, the lack of voltage headroom will limit the signal swing and transistor's fT, imposing the need of bulky inductors or transformers to facilitate the biasing and tune out the parasitics. Thus, the die area is easily penalized, such as 5.76 mm$^2$ in and 2.5 mm$^2$ in one example. The current-reuse topologies should benefit more from technology scaling when the NF is less demanding. Advanced process nodes such as 65 nm CMOS feature sufficiently high-fT and low-VT transistors for GHz circuits to operate at very small bias currents. Unsurprisingly, when cascading the building blocks for current reuse, such as the low-noise amplifier (LNA) plus mixer, the RF bandwidth and linearity can be improved as well, by avoiding any high-impedance nodes at their interface.

Several NF relaxed current-reuse receivers have been reported. An example of an LNA mixer voltage controlled oscillator (VCO) (LMV) cell is illustrated in FIG. 1. In this example, the mixer uses an external LMV cell $L_{ext}$ for narrowband input matching and pre-gain. One LC-tank VCO saves the chip area, but putting the I/Q generation in the LNA ($M_1$-$M_2$) degrades the NF. Only single-balanced mixers ($M_3$-$M_4$) can be used.

Sharing the bias current among more blocks saves power (2.4 mW), but the NF, gain and the input port voltage reflection coefficient ($S_{11}$) are sensitive to its external high-Q inductor ($L_{ext}$) for narrowband input matching and passive pre-gain. Also, under the same bias current, it is hard to optimize the LNA's NF (RF path) with the phase noise of the VCO (LO path). Finally, although a single VCO can save area, the I/Q generation has to be embedded into the LNA. This structure leads to a 3 dB gain loss deteriorating the NF (12 dB), while rendering the I/Q accuracy more susceptible to process variations.

To return the I/Q generation back to the LO path, one GPS receiver design adopts two VCOs to tailor a quadrature LMV (QLMV) cell. Although its power is further optimized (1 mW), three on-chip inductors and one off-chip balun are entailed, penalizing die size and system costs. Also, both LMV and QLMV cells share the same pitfall that only a 50% duty cycle LO (50% LO) can be used for the mixing, which is less effective than 25% LO in terms of gain (i.e., 3 dB higher), NF and I/Q isolation. Finally, as their baseband (BB) channel selection and image rejection are out of their current-reuse paths, any large out-band blockers are necessarily converted into voltages before filtering. This fact constitutes a hard tradeoff between noise, linearity and power (i.e., 1.2 mW baseband power in one example and 5.2 mW baseband power in the above-mentioned GPS receiver).

Another example is a current-reuse circuit-reuse receiver, which merges the RF LNA and baseband transimpedance amplifier (TIA) in one cell, shown in FIG. 2A, in which a circuit-reuse receiver merges an RF LNA and BB TIA. A conceptual view of its operation is given in FIG. 2B, which shows a single-ended equivalent circuit of FIG. 2A, illustrating its RF-to-BB operation conceptually (from right to left).

Without the VCO, and by using passive mixers, this topology can reserve more voltage headroom for the dynamic range. An RF balun is nevertheless entailed for its fully-differential operation, and several constraints limit its NF and linearity: 1) the LNA and TIA must be biased at the same current; 2) the LNA's NF should benefit more from short-channel devices for M1-2, but the baseband TIA prefers long-channel ones to lower the 1/f noise; and 3) any out-band blockers will be amplified at the LNA's (TIA's) output before deep baseband filtering.

SUMMARY

A unified balun low noise amplifier (LNA) and I/Q mixer is used to convert an unbalanced signal to a quadrature signal having a balanced output. A passive/active gain-boosted balun-LNA-I/Q-mixer (blixer) provides an output to an IF-noise-shaping transistorized current-mode lowpass filter and a complex pole load. The lowpass filter shares a common power supply with the blixer, thereby drawing a single bias current. The complex-pole load provides image rejection and channel selection.

In one configuration, the LNA providing separate I and Q channel outputs. A local oscillator multiplexer providing a multiplexed output for providing separate mixing signals for the I and Q channel outputs. The mixer has separate mixing circuits for separately mixing the I and Q channel outputs with the separate mixing signals from the multiplexed output and providing balanced I and Q mixed outputs.

The disclosed technology provides a technique for converting an unbalanced signal to a quadrature signal having a balanced output. An unbalanced signal is received, and a quadrature low noise amplifier (LNA) output signal is provided. A local oscillator (LO) signal is multiplexed for separately mixing as quadrature LO signals, and the quadrature LNA output signal is mixed with the quadrature LO signals to provide mixed quadrature signals. Biquad filtration and complex pole filtering are applied to the mixed quadrature signals, and a buffered output is provided.

BRIEF DESCRIPTION OF THE DRAWINGS

FIG. 1 is a schematic circuit diagram showing LMV cell. $L_{ext}$ is external for narrowband input matching and pre-gain. One LC tank VCO saves the chip area, but putting the I/Q generation in the LNA ($M_1$-$M_2$) degrades the noise figure (NF). Only single-balanced mixers ($M_3$-$M_4$) can be used.

FIGS. 2A and 2B are schematic circuit diagrams showing circuit configurations. FIG. 2A is a schematic circuit diagram showing a circuit-reuse receiver merging RF LNA and baseband TIA. FIG. 2B is a schematic circuit diagram showing a single-ended equivalent circuit illustrating its RF-to-BB operation conceptually (from right to left).

FIG. 4A is a schematic circuit diagram showing the wideband input matching network, balun LNA and I/Q double balanced mixers (Q channel is omitted and the load is simplified as $R_L$). FIG. 4B is a graph showing a variation of the input port voltage reflection coefficient ($S_{11}$) bandwidth with bondwire inductance $L_{BW}$. FIG. 4C is a graph showing a Power of $A_{GB}$ versus NF.

FIGS. 5A and 5B are a schematic circuit diagram showing operation of the I-channel double balanced mixer. It inherently offers output balancing after averaging in one LO cycle as shown in their FIG. 5A is a diagram showing a first-half LO cycle. FIG. 5B is a diagram showing a second-half LO cycle. FIG. 5C is a diagram showing resultant voltages for both of the 5A and 5B circuits.

FIG. 6A is a schematic circuit diagram showing an IF noise-shaping biquad filter. FIG. 6B is a schematic circuit diagram showing a its small-signal equivalent circuit showing the noise TF of Mn.

FIGS. 7A and 7B are diagrams showing impedance and noise. FIG. 7A is a diagram showing an equivalent impedance of $Z_P$ versus $\omega_{or}$. FIG. 7B is a diagram showing a simulated noise TF of $$\frac{i_{n,out}}{i_{n,Mf1}}$$

with and without $L_{act}$.

FIG. 8 is a diagram showing simulated $NF_{Total}$ (at $V_{o,lp}$ and $V_{o,ln}$) with and without $L_{act}$.

Figure 9A:
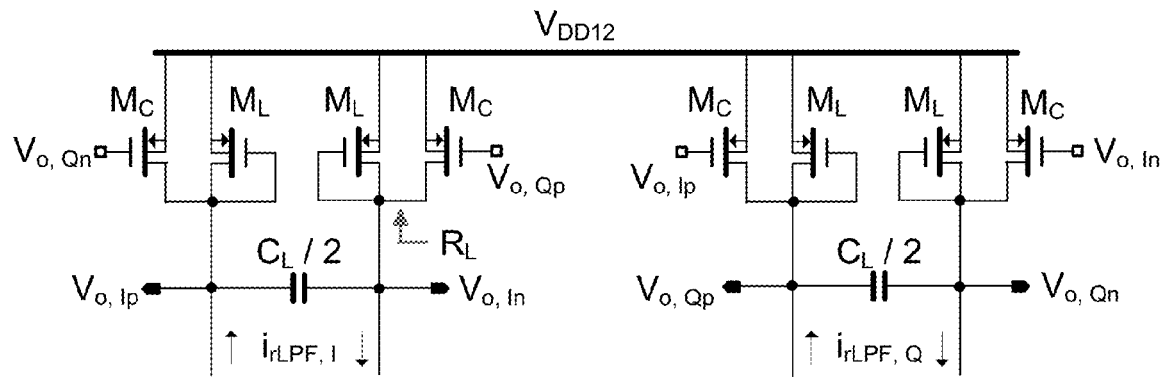
Figure 9B:
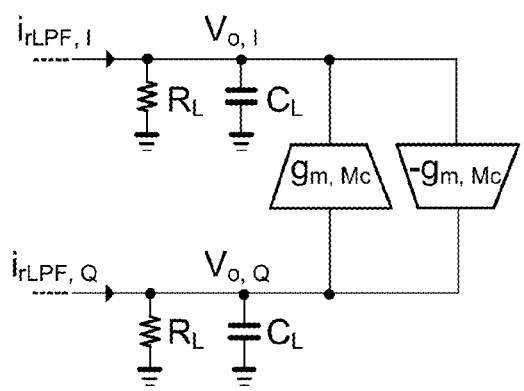
Figure 9C:
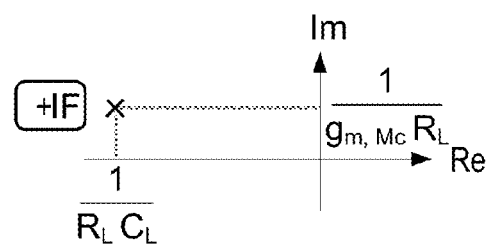

FIGS. 9A-C are diagrams showing a complex pole load, its small-signal equivalent circuit and pole plot. FIG. 9 A is a schematic circuit diagram showing a complex pole load. FIG. 9B is a schematic circuit diagram showing the small-signal equivalent circuit of FIG. 9A. FIG. 9C is a diagram showing a pole plot of the circuit of FIGS. 9A and 9B.

Figure 10:
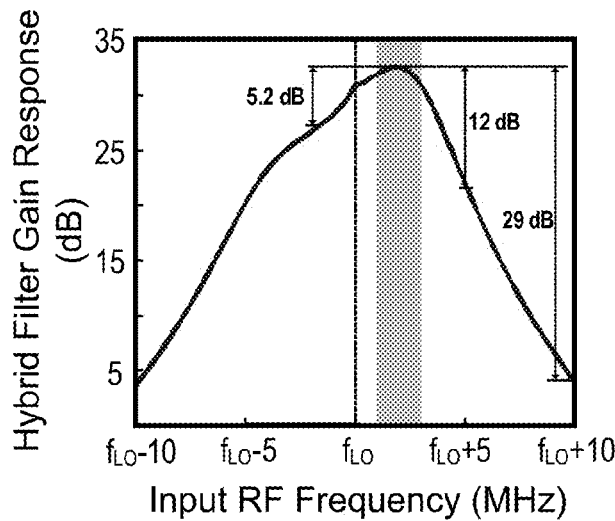

FIG. 10 is a diagram showing simulated hybrid filter gain response.

Figure 11A:
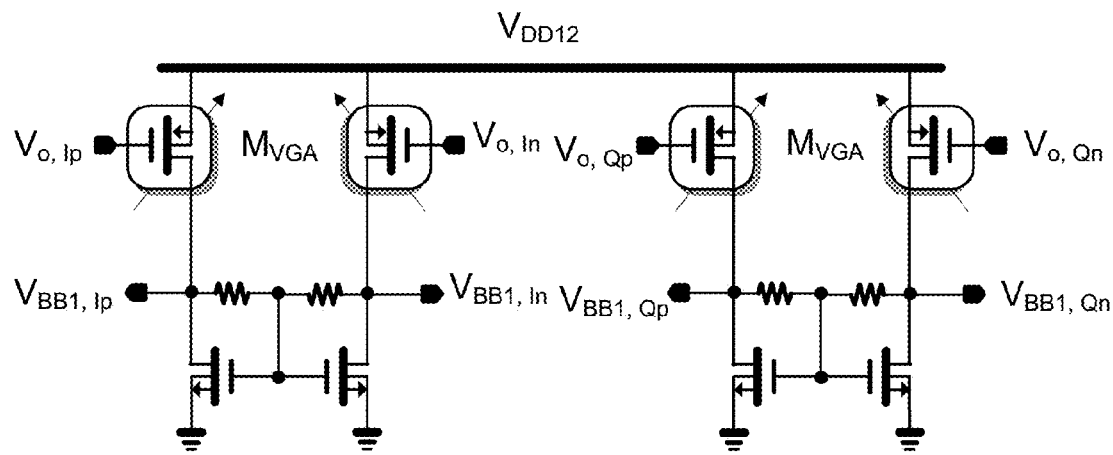
Figure 11B:
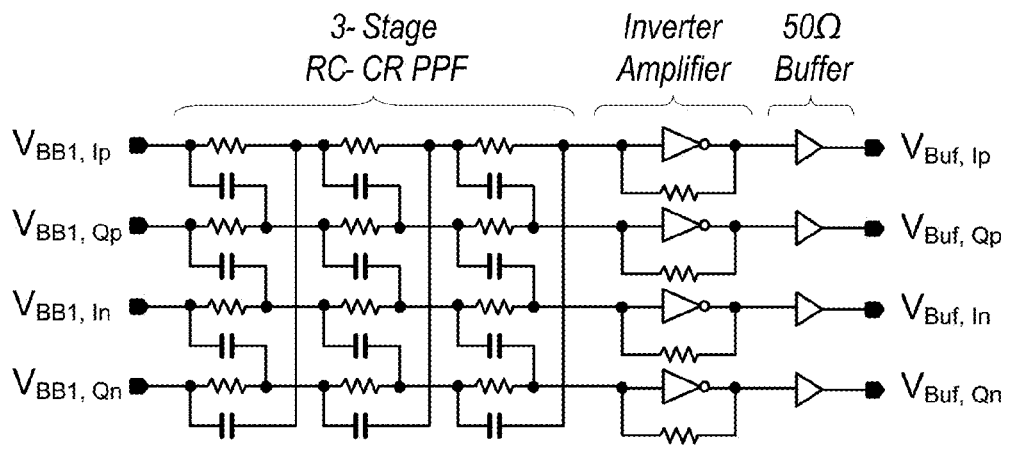

FIGS. 11A and 11B are schematic circuit diagrams of the baseband circuitry. FIG. 11 A is a schematic circuit diagram showing a VGA. FIG. 11 B is a schematic circuit diagram showing a 3-stage RC-CR PPF, inverter amplifier and 50Ω buffer.

Figure 12:
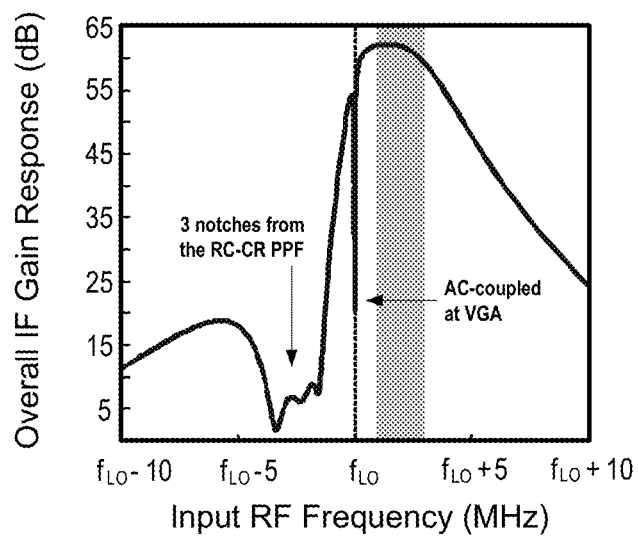

FIG. 12 is a diagram showing simulated overall IF gain response.

Figure 13A:
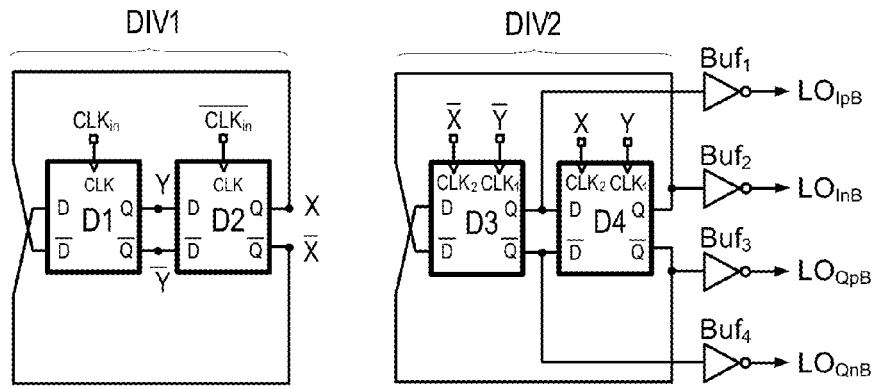
Figure 13B:
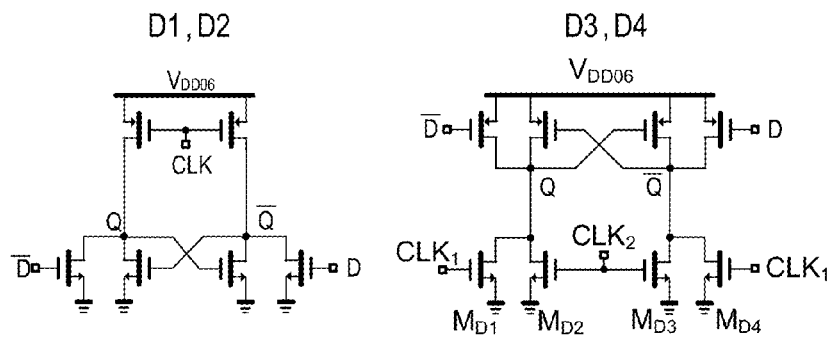
Figure 13C:
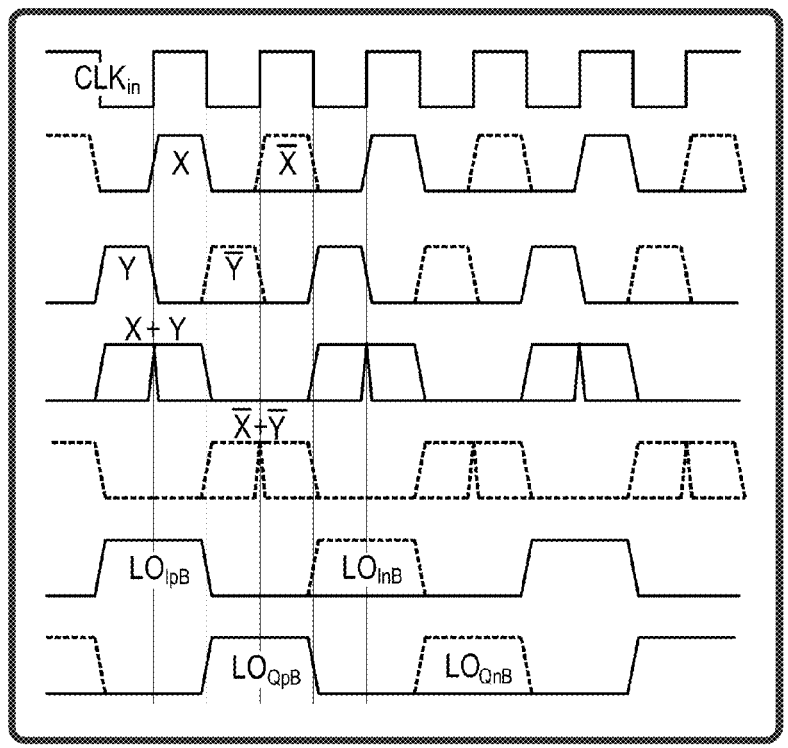

FIGS. 13A-C are diagrams showing DIV1 and DIV2, and their timing diagrams. FIG. 13A is a schematic circuit diagram in block form showing divider circuits. FIG. 13 B is a schematic circuit diagram showing the divider circuits.

FIG. 13C is a diagram showing the timing diagrams of the circuits of FIGS. 13A and 13B.

Figure 14A:
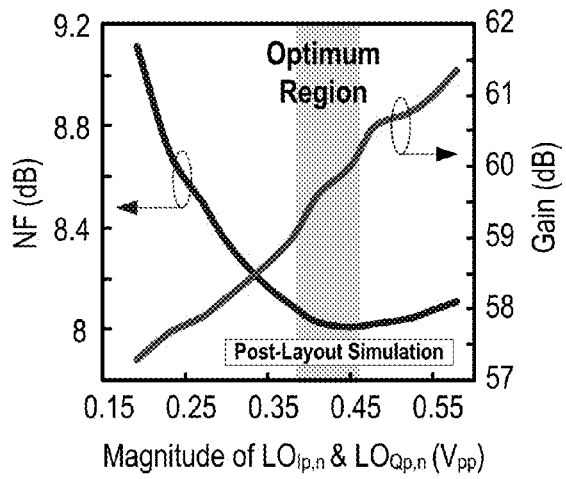
Figure 14B:
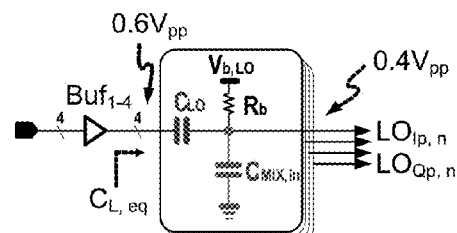

FIGS. 14A-B are diagrams showing post layout simulations. FIG. 14A is a graphical depiction showing a post-layout simulation of NF and gain versus LO's amplitude. FIG. 14B is a schematic circuit diagram showing an additional $C_{LO}$ generating the optimum LO's amplitude.

Figure 15A:
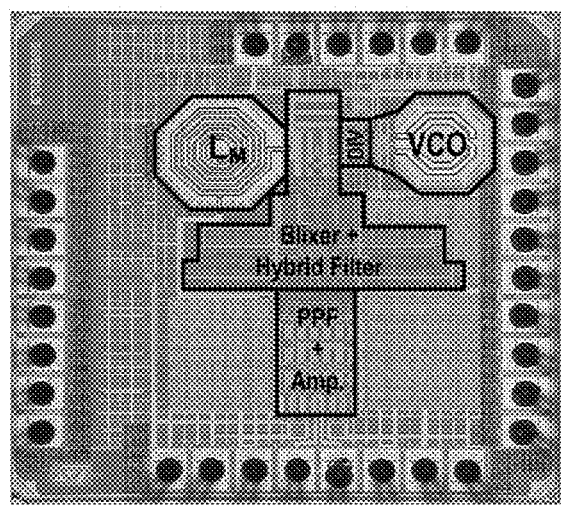
Figure 15B:
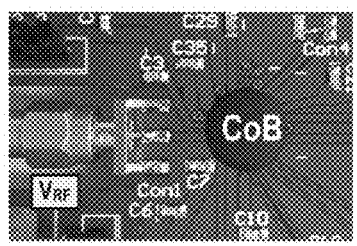
Figure 15C:
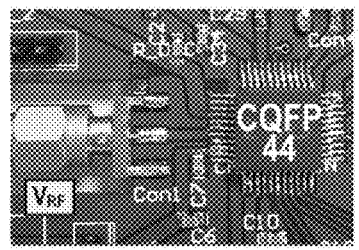

FIGS. 15A-C are photographic depictions of the receiver. FIG. 15A is a photomicrograph showing the the receiver chip, tested under CoB and CQFP44 packaging. FIGS. 15B and C are depictions of circuit connections for the receiver chip of FIG. 15A.

Figure 16A:
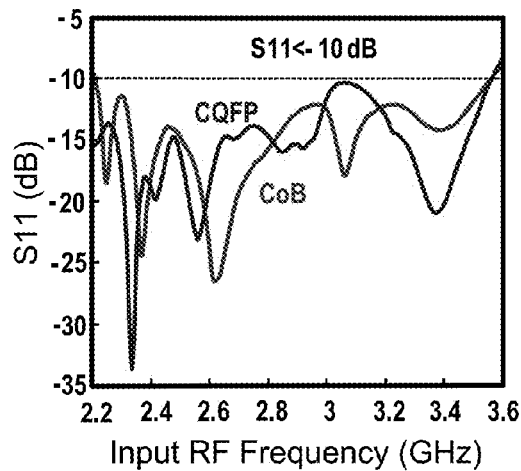
Figure 16B:
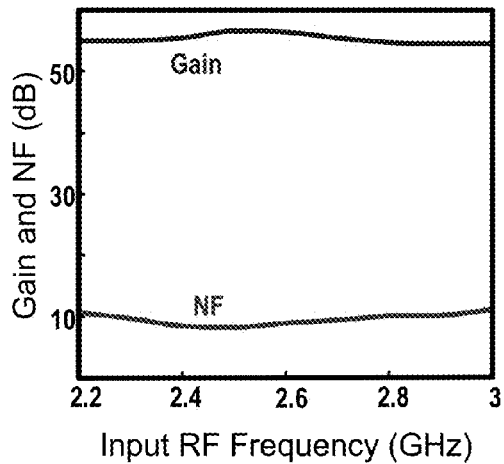
Figure 16C:
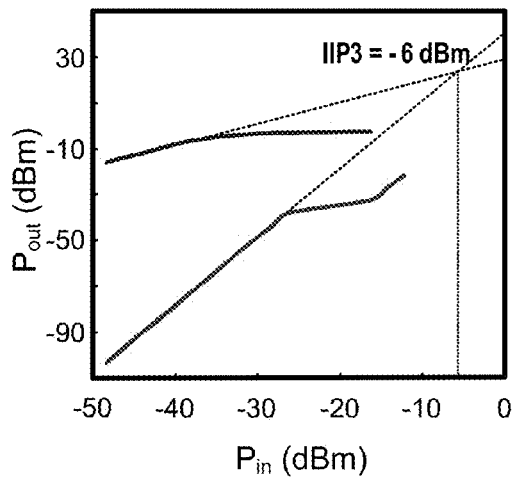
Figure 16D:
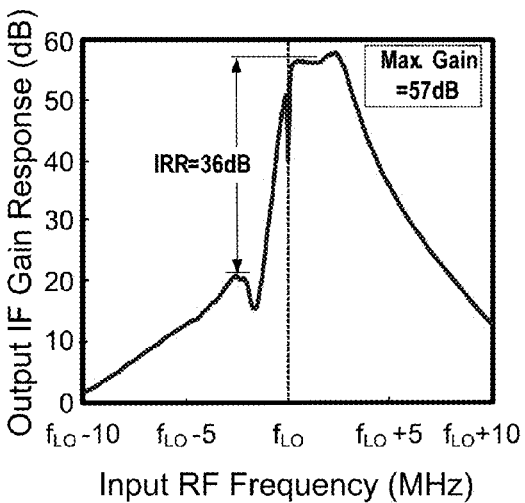

FIGS. 16A-D are graphical diagrams showing measured profiles for the receiver of FIGS. 15A-C. FIG. 16A is a graphical diagram showing measured input port voltage reflection coefficient ($S_{11}$), FIG. 16B is a graphical diagram showing measured wide band gain and NF, FIG. 16C is a graphical diagram showing a measured $IIP3_{out-band}$. FIG. 16D is a graphical diagram showing a measured low IF filtering profile.

Figure 17A:
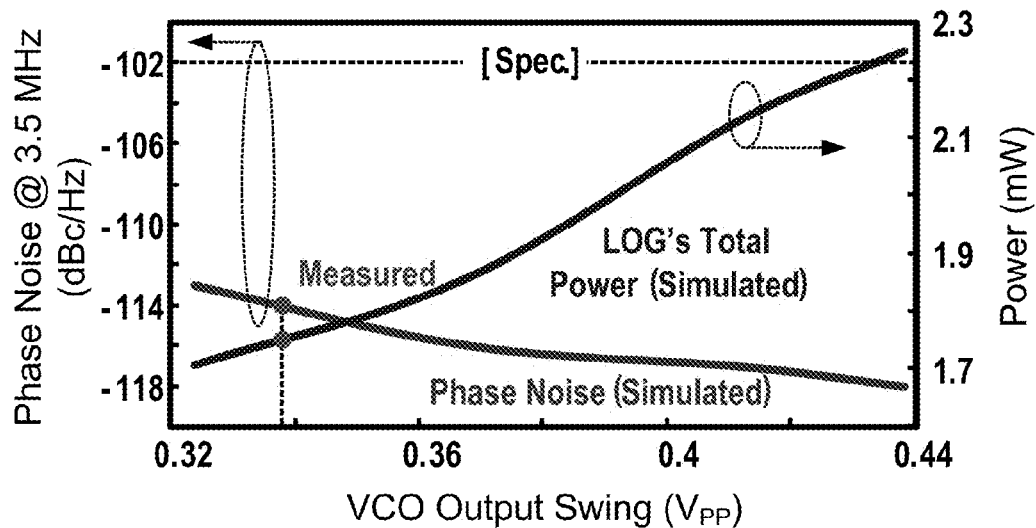
Figure 17B:
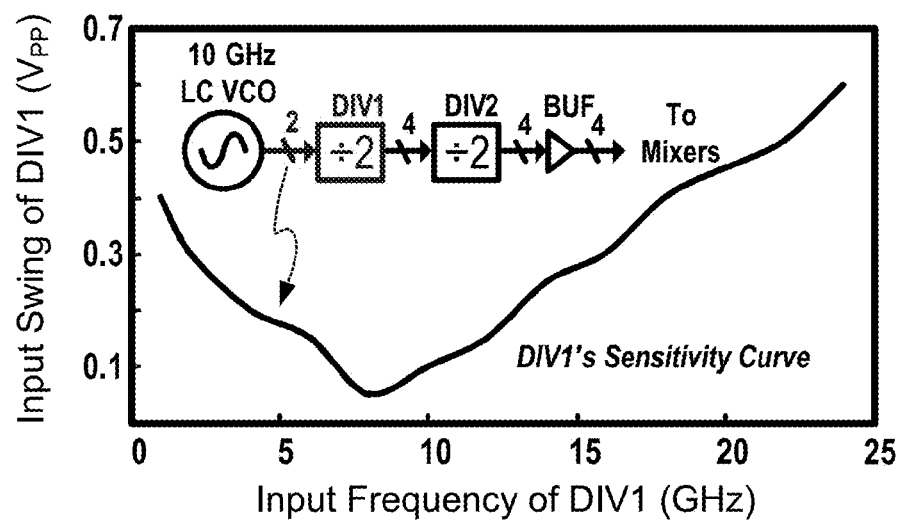

FIGS. 17A and 17B are graphical diagrams showing noise and input swing.

FIG. 17A is a graphical diagram showing measured phase noise has enough margin to the specifications, showing that from simulations it is a tradeoff with the power budget according to the VCO's output swing. FIG. 17B is a graphical diagram showing a simulated sensitivity curve of DIV1 showing its small input voltage requirement at ~10 GHz.

DETAILED DESCRIPTION

Overview

The present disclosure describes the details of an extensive-current reuse ZigBee receiver with most RF-to-BB functions merged in one cell, while avoiding any external components for input-impedance matching. Together with a number of ULP circuits and optimization techniques, the receiver fabricated in 65 nm CMOS measures high performances in terms of IIP3, input port voltage reflection coefficient ($S_{11}$) bandwidth, power and area efficiencies with respect to the prior art.

In one example, a 2.4 GHz ZigBee receiver unifying a balun, a low noise amplifier (LNA) and an I/Q mixer as a unified balun LNA I/Q mixer (Blixer) and a baseband (BB) hybrid filter in one cell is fabricated in 65 nm CMOS. Without any external components, wideband input matching and passive pre-gain are concurrently achieved via co-optimizing an integrated low-Q network with a balun LNA. The latter also features active-gain boosting and partial-noise canceling to enhance the gain and noise figure (NF). Above the balun LNA are I/Q double-balanced mixers driven by a 4-phase 25% LO for down-conversion and gain phase balancing. The generated baseband currents are immediately filtered by an IF noise-shaping current mode biquad filter and a complex pole load, offering 1st-order image rejection and 3rd-order channel selection directly atop the blixer. Together with other baseband and LO circuitries, the receiver measures 8.5 dB NF, 57 dB gain and −6 dBm IIP3out-band at 1.7 mW power and 0.24 mm$^2$ die size. The input port voltage reflection coefficient ($S_{11}$) bandwidth (<−10 dB) covers 2.25 to 3.55 GHz being robust to packaging variations. Most performance metrics compare favorably with the state-of-the-art.

Current-Reuse Receiver Architecture

Figure 3:
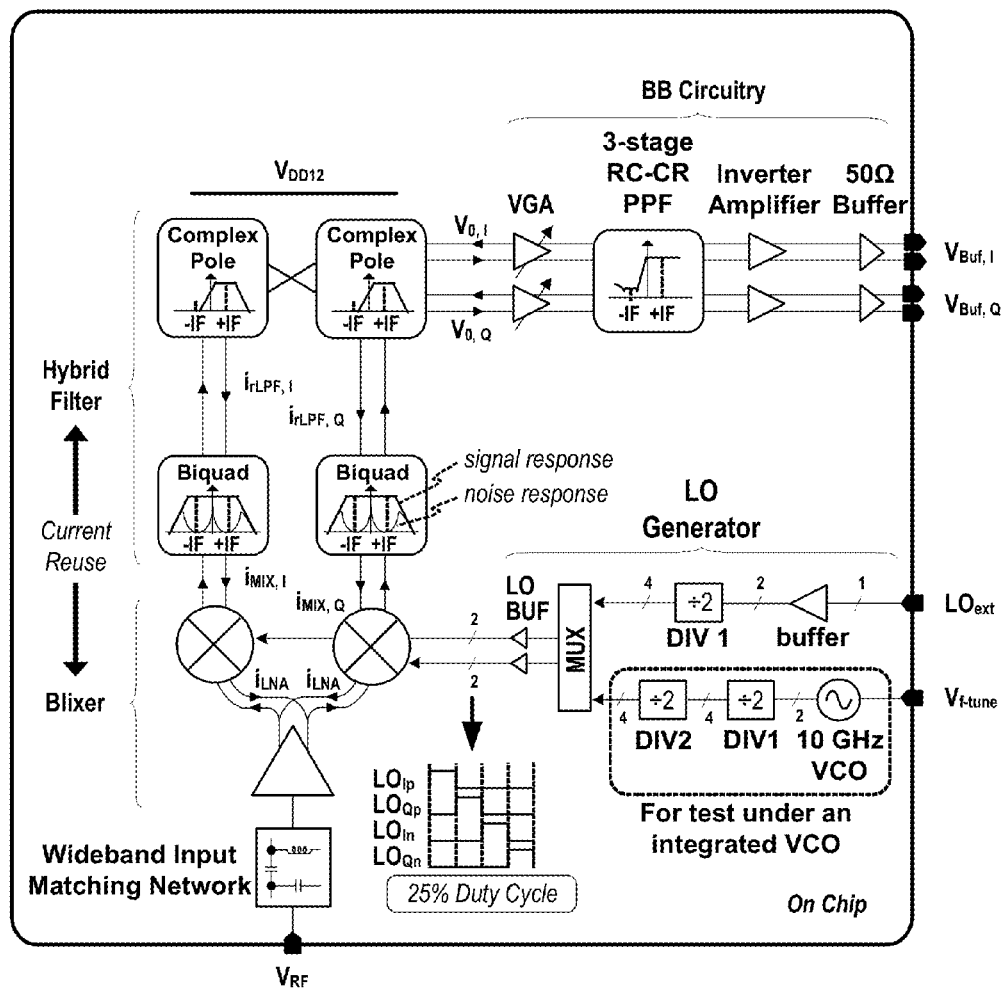
FIG. 3 is a schematic circuit diagram showing an RF-to-BB current-reuse ZigBee receiver.

FIG. 3 is a schematic block diagram showing a RF-to-BB current-reuse ZigBee receiver. As is the case with the QLMV cell, merging the LO path with the signal path is not that desirable, as they will add noise to each other and induce signal loss. Stacking of building blocks should be in conformity with the signal flow from RF to BB, such that all bias currents serve only the signal currents. In this work, the LO path is separated, which also facilitates the use of a 25% LO for better overall performances than in its 50% counterpart. The single-ended RF input ($V_{RF}$) is taken by a low-Q input-matching network before reaching the balun LNA I/Q mixer, which is referred to as a "blixer". Merging the balun with the hybrid filter allows the signal to be transferred from one block to another in the current domain. Merging the balun with the hybrid filter not only saves power by sharing their bias current under a single supply, but also reduces the voltage swing at internal nodes due to the inherently low input impedance of the hybrid filter, benefitting the linearity. This avoids explicit voltage-to-current and current-to-voltage interfaces, resulting in power savings. This arrangement also reduces voltage swings at internal nodes due to the inherently low input impedance of the hybrid filter, thus benefitting the linearity. The wideband input-matching network is also responsible for the pre-gain to enhance the NF. Unlike the LMV cell that only can utilize single-balanced mixers, the balun LNA features a differential output ($\pm i_{LNA}$), which allows the use of double-balanced mixers (DBMs). The balun is driven by a 4-phase 25% LO, the I/Q double balanced mixers with a large output resistance that robustly corrects the differential imbalances of $\pm i_{LNA}$. The balanced baseband currents ($\pm i_{MIX,I}$ and $\pm i_{MIX,Q}$) are then filtered directly in the current domain by a current mode biquad filter stacked atop the double balanced mixer. The biquad filter features in-band noise shaping centered at the desired intermediate frequency (IF, 2 MHz). Only the filtered output currents ($\pm i_{rLPF,I}$ and $\pm i_{rLPF,Q}$) are returned as voltages ($\pm V_{o,I}$ and $\pm V_{o,Q}$) through the complex pole load, which performs both image rejection and channel selection. As the RF to baseband functions (balun LNA, DBM and baseband filter) are stacked in one cell, the signal processing can be kept in the current domain before adequate baseband filtering for better linearity, while the whole receiver only draws one bias current or a single bias current.

Out of the current-reuse path there is a high-swing variable-gain amplifier (VGA). It essentially deals with the gain loss of its succeeding 3-stage RC-CR polyphase filter (PPF), which is responsible for large and robust image rejection over mismatches and process variations. The final stage is an inverter amplifier before 50Ω test buffering. The 4-phase 25% LO can be generated by an external 4.8 GHz reference ($LO_{ext}$) after a divide-by-2 (DIV1) that features 50% input 25% output, or from an integrated 10 GHz voltage controlled oscillator (VCO) after DIV1 and DIV2 (25% input 25% output) for additional testability.

Wideband Input-Matching Network

Figure 4A:
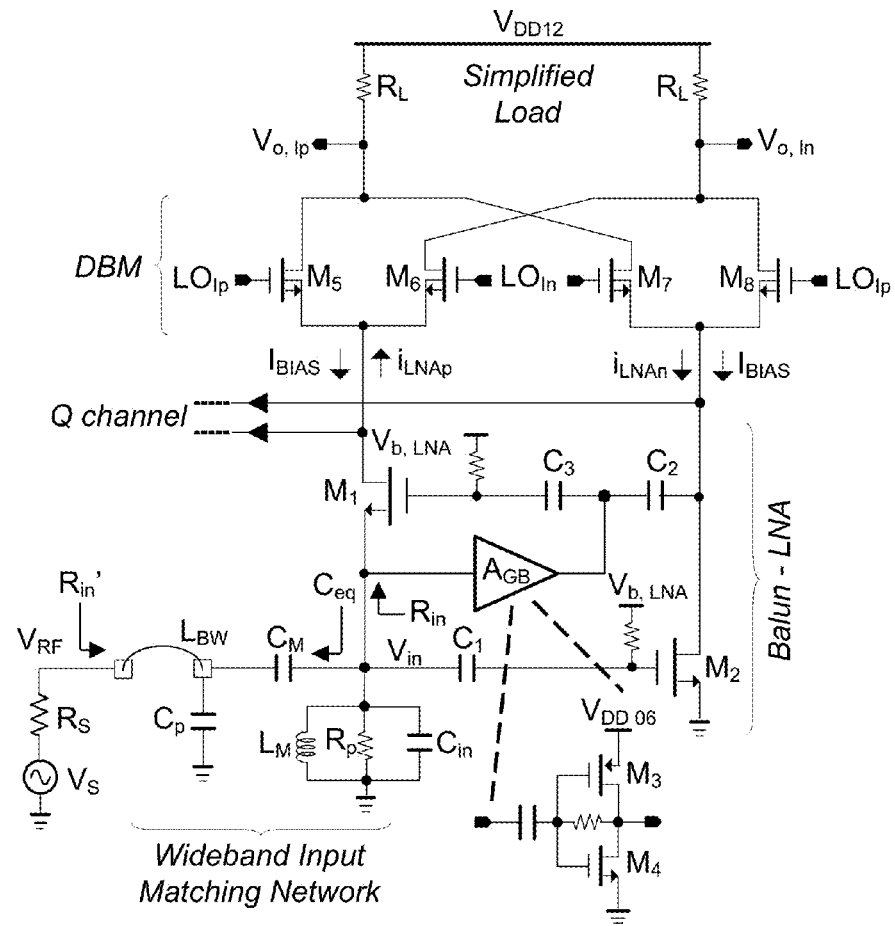
FIGS. 4A-C are diagrams showing a wideband input matching network, balun LNA and I/Q DBMs.

Its schematic is illustrated in FIG. 4A. A low-Q inductor ($L_M$) and two tapped capacitors ($C_p$ and $C_M$) are employed for impedance down-conversion resonant and passive pre-gain. $L_M$ also serves as the bias inductor for $M_1$. $R_p$ is the parallel shunt resistance of $L_M$. $C_p$ stands for the parasitic capacitance from the pad and ESD diodes. $R_{in}$ and $C_{in}$ are the equivalent resistance and capacitance at node $V_{in}$, respectively. $R'_{in}$ is the downconversion resistance of $R_{in}$. $L_{BW}$ is the bondwire inductance and $R_s$ is the source resistance. To simplify the analysis, we first omit $L_{BW}$ and $C_{in}$, so that $L_M$, $C_p$, $C_M$, $R_S$ and $R_T$ ($=R_p//R_{in}$) together form a tapped capacitor facilitating the input matching. Generally, $S_{11} \leq -10$ dB is required and the desired value of $R'_{in}$ is from 26 to 97Ω over the frequency band of interest. Thus, given the $R_T$ and $C_M$ values, the tolerable $C_p$ can be derived from $$R'_{in} = R_T \left(\frac{C_M}{C_M + C_p}\right)^2.$$

The pre-gain value ($A_{pre,amp}$) from $V_{RF}$ to $V_{in}$ is derived from $$\frac{V_{in}^2}{2R_T} = \frac{V_{RF}^2}{2R_S},$$

which can be simplified as $$A_{pre,amp} = \sqrt{\frac{R_T}{R_S}}.$$

The -3 dB bandwidth of $A_{pre,amp}$ is related to the network's quality factor ($Q_n$) as given by:

$$Q_n = \frac{R_T}{2\omega_0 L} = \frac{\omega_0}{2\omega_{-3dB}},$$

with $$\omega_0 = \frac{1}{\sqrt{L_M C_{EQ}}}$$

and $$C_{EQ} = \frac{C_M C_P}{C_M + C_P}$$

In the disclosed design
$R_T$=150Ω,
$C_M$=1.5 pF,
$L_M$=4.16 nH,
$R_p$=600Ω,
$C_p$=1 pF and
$R_{in}$=200Ω),
$A_{pre,amp}$ has a passband gain of ~4.7 dB over a 2.4 GHz bandwidth (at RF=2.4 GHz) under a low $Q_n$ of 1.

Figure 4B:
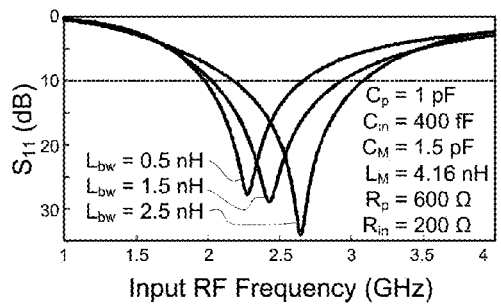

Thus, the tolerable $C_p$ is sufficiently wide (0.37 to 2.1 pF). The low-Q $L_M$ is extremely compact (0.048 mm²) in the layout and keeps induced parasitic capacitance to a low level (~260 fF, part of $C_{in}$) as a result of the compact layout. FIG. 4B demonstrates the robustness of input port voltage reflection coefficient ($S_{11}$) bandwidth against Law from 0.5 to 2.5 nH. The variation of $C_{in}$ to $Sn_1$ bandwidth was also taken into consideration. From simulations, the tolerable $C_{in}$ is 300 to 500 fF at $L_{BW}$=1.5 nH.

Figure 4C:
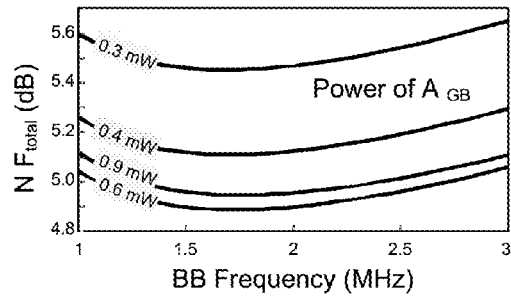

The correlation between the input port voltage reflection coefficient ($S_{11}$) bandwidth and $Q_n$ is derived in as described below with reference to FIGS. 4A-C. FIG. 4A is a diagram showing wideband input matching network, balun LNA and I/Q double balanced mixers (Q channel is omitted and the load is simplified as RL). FIGS. 4B and 4C are graphical depictions of characteristics of the network of FIG. 4A. FIG. 4B shows variation of the input port voltage reflection coefficient ($S_{11}$) bandwidth with bondwire inductance LBW. FIG. 4C shows power of AGB versus NF.

$S_{11}$<-10 dB Bandwidth Versus the Q Factor (Qn)

A number of ULP circuits and optimization techniques have been applied based on the input port voltage reflection coefficient ($S_{11}$), by comparing $S_{11}$<-10 dB bandwidth versus the Q factor ($Q_n$) of the input-Matching Network. At the resonant frequency $\omega_0$, $L_M$ can resonate perfectly with $C_{EQ}$ and $R'_{in}$ for an exact 50Ω. At a lower frequency $\omega=\omega_0-\Delta\omega_L$, ($\Delta\omega_L$>0), the imaginary part of $L_M//C_{EQ}$ is non-zero, making $R'_{in}$<50Ω. This imaginary part is expressed as $L_{eff}$, and derived as follows, $$sL_M \,//\, sC_{EQ} = \frac{sL_M}{1+s^2 C_{EQ} L_M} \quad (A\text{-}1)$$

Let, where, and if substituted into (A-1), we will have, $$\frac{j(\omega_0 - \Delta\omega_L)L_M}{1 - \frac{(\omega_0 - \Delta\omega_L)^2}{\omega_0^2}} \approx \frac{j(\omega_0 - \Delta\omega_L)L_M}{2\frac{\Delta\omega_L}{\omega_0}} = L_{\mathit{eff}} \quad (A\text{-}2)$$

where $$\frac{\Delta\omega_L}{\omega_0} \ll 2$$

is assumed. Here, the parallel of $$|L_{\mathit{eff}}| \,\|\, R_T$$

is down-converted to $R'_{in}=26\Omega$ by $C_M$ and $C_p$, thus, $$\frac{|L_{\mathit{eff}}|R_T}{|L_{\mathit{eff}}|+R_T}\left(\frac{C_M}{C_M+C_P}\right)^2 = 26\Omega \quad (A\text{-}3)$$

Substituting (A-2) into (A-3) and simplifying them, the normalized low-side frequency is obtained, $$\frac{\Delta\omega_L}{\omega_0} = \frac{1}{1+\frac{4aQ_n}{R_T - a}} \quad (A\text{-}4)$$

where $$a = 26\left(\frac{C_M+C_P}{C_M}\right)^2$$

Then, the whole matching bandwidth is close to twice the value derived in (A-1) if the upper-side is included. (A-4) confirms that the input port voltage reflection coefficient ($S_{11}$) bandwidth can be significantly extended by designing a low $Q_n$ using the size flexibility of the inductor.

Balun LNA with Active Gain Boost and Partial Noise Canceling

The common-gate (CG) common-source (CS) balun LNA avoids a need for the use of an off-chip balun, and achieves a low NF by noise canceling, but the asymmetric CG-CS transconductances and loads make the output balancing inconsistent in the wideband. In other configurations, output balancing is achieved by scaling $M_5$-$M_8$ with cross-connection at baseband, but that is incompatible with implementations that that include a hybrid filter.

In yet other designs, an AC-coupled CS branch is introduced, along with a differential current balancer (DCB). In this arrangement, the same load is allowed for both CS and CG branches for wideband output balancing. Thus, the NF of such a balun LNA can be optimized independently. This technique is transferred to this ULP design, but only with the I/Q double balanced mixers inherently serve as the DCB, avoiding a high voltage supply.

Again referring to FIGS. 4A-C, FIG. 4A is a detailed schematic of the wideband input matching network, balun LNA and I/Q double balanced mixers. To maximize the voltage headroom, $M_1$ (with $g_{m,CG}$) and $M_2$ (with $g_{m,CS}$) were sized with non-minimum channel length (L=0.18 μm) to lower their $V_T$. The AC-coupled gain stage is a self-biased inverter amplifier ($A_{GB}$) powered at 0.6 V ($V_{DD06}$) to enhance its transconductance ($g_{m,AGB}$)-to-current ratio. It gain-boosts the CS branch while creating a loop gain around $M_1$ to enhance its effective transconductance under less bias current ($I_{BIAS}$). This scheme also allows the same $I_{BIAS}$ for both $M_1$ and $M_2$, requiring no scaling of load (i.e., only $R_L$). Furthermore, a small $I_{BIAS}$ lowers the supply requirement, making a 1.2 V supply ($V_{DD12}$) still adequate for the balun LNA I/Q mixer and hybrid filter, while relaxing the required LO swing ($LO_{Ip}$ and $LO_{In}$). $C_1$-$C_3$ provide for biasing and are typical metal-oxide-metal (MoM) capacitors to minimize parasitics.

The balun LNA provides partial-noise canceling as a result of the CG and CS parallel amplification. When using a simplified set of criteria, the noise induced by double balanced mixer ($M_5$-$M_8$) and the effect of channel-length modulation can be ignored. The noise transfer function (TF) of $M_1$'s noise ($I_{n,CG}$) to the baseband differential output ($V_{o,Ip}$-$V_{o,In}$) was derived when $LO_{Ip}$ is high, and the input impedance is matched, $$TF_{I_{n,CG}} = -\frac{1}{2}(R_L - R_{in}G_m,C_s R_L)$$

where $G_{m,CS} = g_{m,CS} + g_{m,AGB}$.

The noise of $M_1$ can be fully canceled if $R_{in}G_{m,CS}=1$ is satisfied, but as analyzed in subsection III-A, $R_{in}=200\Omega$ is desired for input matching at low power. Thus, $G_{m,CS}$ should be ≈5 mS, rendering the noises of $G_{m,CS}$ and $R_L$ still significant. Device sizings for full noise cancellation of $M_1$ should not lead to the lowest total NF ($NF_{total}$). In fact, one can get a more optimized $G_{m,CS}$ (via $g_{m,AGB}$) for stronger reduction of noise from $G_{m,CS}$ and $R_L$, instead of that from $M_1$. Although this noise-canceling principle has been used in a single-ended LNA, the output balancing was not a concern there. According to the present disclosure, the optimization process is alleviated since the output balancing (relying on $M_5$-$M_8$) and NF (relying on $A_{GB}$) are decoupled. Referring to FIG. 4A, this can be seen at the section identified by $M_5$-$M_8$ with cross-connection at baseband. The simulated $NF_{total}$ up to the $V_{o,Ip}$ and $V_{o,In}$ nodes against the power given to the $A_{GB}$ is given in FIG. 4C. $NF_{total}$ is reduced from 5.5 dB at 0.3 mW to 4.9 dB at 0.6 mW, but is back to 5 dB at 0.9 mW.

NF of the Balun LNA Versus the Gain (Gm,CS) of the CS Branch

The relationship of $G_{m,CS}$ and $NF_{total}$ is also applicable to a balun LNA. FIGS. 4B and 4C show the NF of the balun LNA versus the gain ($G_{m,CS}$) of the CS branch with $A_{GB}$ that guide the optimization.

The $NF_{total}$ can be reduced by increasing $g_{m,AGB}$ under fixed $g_{m,CG}$ and $g_{m,CS}$, under matched input impedance. The noises from the I/Q double balanced mixers and their harmonic-folding terms, and the resistor $R_p$, are excluded for simplicity. Also, the conversion gain of the active mixers is assumed to be unity. Here $G_{m,CS}$ is upsized from $G_{m0,CS}$ to $G_{m,CS}=G_{m0,CS}+\Delta G_{m,CS}$, where $G_{m0\_CS}$ is the value for full noise cancellation of CG branch, i.e., $R_{in} G_{m0,CS}=1$.

The four major noise sources considered here are the thermal noises, which are derived from:

RS: $(V_{n,Rs}^2=4kTR_S)$,

M1: $(I_{n,CG}^2=4kT\gamma g_{m,CG})$, $M_2+A_{GB}$: $(I_{n,CS}^2=4kT\gamma G_{m,CS})$, and $R_L$: $(V_{n,L}^2=4kTR_L)$, where $\gamma$ is the bias-dependent coefficient of the channel thermal noise. The noise contributed by the CG branch can be deduced as, $$NFg_{m,CG} = \frac{V_{n,out,CG}^2}{V_{n,out,R_S}^2} = \frac{\frac{1}{4}I_{nCG}^2[R_L-R_{in}(G_{m0,CS}+\Delta G_{m,CS})R_L]^2}{4kTR_SA_{pre,amp}^2 \times \frac{1}{4} \times \left[\frac{R_L}{R_{in}}+(G_{m0,CS}+\Delta G_{m,CS})R_L\right]^2} \quad (B\text{-}1)$$

$$= \frac{\gamma g_{m,CG}(R_{in}R_L\Delta G_{m,CS})^2}{R_SA_{pre,amp}^2\left(\frac{2R_L}{R_{in}}+\Delta G_{m,CS}R_L\right)^2}$$

$$\approx \frac{\gamma g_{m,CG}(R_{in}^4(\Delta G_{m,CS})^2)}{4A_{pre,amp}^2R_S}$$

where $\frac{2R_L}{R_{in}} \gg \Delta G_{m,CS}R_L$

If $\Delta G_{m,CS}$ is increased, the noise from M1 also moves up. For the noise contribution of the CS branch, we can derive its TF to the output (Vout) as, $$TF_{G_{m,CS} \to V_{out}} = \frac{R_L}{1+T}\left[\frac{T}{R_{in}(G_{m0,CS}+\Delta G_{m,CS})}+1\right] \approx R_L(1-\Delta G_{m,CS}R_{in})$$

where T is the loop gain $\gg 1$. With it, the NF of and NF of RL can be derived, $$NF_{G_{m,CG}} = \frac{V_{n,out,CG}^2}{V_{n,out,R_S}^2} = \frac{4kT\gamma(G_{m,CS}+\Delta G_{m,CS})(TF_{G_{m,CS} \to V_{out}})^2}{4kTR_SA_{pre,amp}^2 \times \frac{1}{4} \times \left[\frac{2R_L}{R_{in}}+\Delta G_{m,CS}R_L\right]^2} \quad (B\text{-}2)$$

$$\approx \frac{\gamma R_{in}^2(G_{m0,CS}+\Delta G_{m,CS})(1-\Delta G_{m,CS}R_{in})^2}{R_SA_{pre,amp}^2R_S}$$

$$\approx \frac{\gamma R_{in}^4(1-\Delta G_{m,CS}R_{in})^2}{R_sA_{pre,amp}^2}$$

where $\frac{2R_L}{R_{in}} \gg \Delta G_{m,CS}R_L$

With it, the NF of $G_{m,CS}$ and NF of $R_L$ can be derived, then $$NF_{R_L} = \frac{4kTR_L}{4kTR_SA_{pre,amp}^2 \times \frac{1}{4} \times \left[\frac{R_L}{R_{in}}(G_{m,CS}+\Delta G_{m,CS})R_L\right]^2} \quad (B\text{-}3)$$

$$\approx \frac{4R_L}{R_SA_{pre,amp}^2} \times \frac{1}{\left(\frac{4R_L^2}{R_{in}^2}+\frac{2\Delta G_{m,CS}R_L^2}{R_{in}}\right)}$$

$$\approx \frac{R_{in}^2}{R_LR_SA_{pre,amp}^2} \times \left(1-\frac{\Delta G_{m,CS}R_{in}}{2}\right)$$

As expected, when $\Delta G_{m,CS}$ is increased the noise contribution of $G_{m,CS}$ and $R_L$ can be reduced. The optimal $\Delta G_{m,CS}$ can be derived from $$\frac{\partial NF_{total}}{\partial \Delta G_{m,CS}} = 0,$$

where $$NF_{total} = 1 + NF_{G_{m,CG}} + NF_{G_{m,CS}} + 2NF_{R_L}$$

Double-Balanced Mixers Offering Output Balancing

The active-gain-boosted balun LNA can only generate unbalanced outputs. The output balancing is inherently performed by the I/Q double balanced mixers under a 4-phase 25% LO. For simplicity, this principle is described for the I channel only under a 2-phase 50% LO, as shown in FIGS. 5A and 5B, where the load is simplified as $R_L$. During the first-half LO cycle when LO is high, $LO_{Ip}$ goes up and appears at $V_{o,Ip}$ while $i_{LNAn}$ goes down and appears at $V_{o,In}$. In the second-half LO cycle, both of the currents' sign and current paths of $i_{LNAp}$ and $i_{LNAn}$ are flipped. Thus, when they are summed at the output during the whole LO cycle, a robust output balance is obtained. The output balancing is robust, due to the large output resistance (9 k$\Omega$) of $M_5$-$M_8$ enabled by the very small $I_{BIAS}$ (85 $\mu$A). To analytically prove the principle, we let $$i_{LNAp}=\alpha I_A \cos(\omega_S t+\phi_1)$$

and $$i_{LNAn}=-I_A \cos(\omega_S t+\phi_2) \times \cos \omega_0 t,$$

where $I_A$ is the amplitude, $\omega_s$ is the input signal frequency, $\alpha$ is the unbalanced gain factor and $\phi_1$ and $\phi_2$ are their arbitrary initial phases.

When there is sufficient filtering to remove the high-order terms, we can deduce the baseband currents $i_{MIX,Ip}$ and $i_{MIX,In}$ as given by, $$i_{MIX,Ip} = \frac{2}{\pi}\alpha I_A \cos(\omega_S t+\varphi_1)\times\cos\omega_0 t + \frac{2}{\pi}I_A\cos(\omega_S t+\varphi_2)\times\cos\omega_0 t \quad (2)$$

$$= \frac{\alpha I_A}{\pi}\cos(\omega_S t+\omega_0 t+\varphi_1) + \frac{I_A}{\pi}\cos(\omega_0 t-\omega_S t+\varphi_2)$$

so $$i_{MIX,In} = \frac{I_A}{\pi}\cos(\omega_S t + \omega_0 t + \varphi_2) + \frac{\alpha I_A}{\pi}\cos(\omega_0 t - \omega_S t + \varphi_1) \quad (3)$$
$$= -i_{MIX,Ip}$$

From the deduced baseband currents, a consistent proof for I/Q double balanced mixers under a 4-phase 25% LO is obtained. Ideally, from (2)-(3), the double balanced mixer can correct perfectly the gain and phase errors from the balun LNA, independent of its different output impedances from the CG and CS branches. In fact, even if the conversion gain of the two mixer pairs ($M_5$, $M_8$ and $M_6$, $M_7$) does not match (e.g., due to non-50% LO duty cycle), the double-balanced operation can still generate balanced outputs (confirmed by simulations). Of course, the output impedance of the double balanced mixer can be affected by that of the balun LNA, as shown in FIG. 4A, but is highly desensitized by employing a small size $R_L$ (i.e., the input impedance of the hybrid filter) originally aimed for current mode operation. Thus, the intrinsic imbalance between $V_{o,Ip}$ and $V_{o,In}$ is negligibly small (confirmed by simulations).

For devices sizing, a longer channel length (L=0.18 μm) is preferred for $M_{5-8}$ to reduce their 1/f noise and $V_T$. Hard-switch mixing helps to desensitize the I/Q double balanced mixers to LO gain error, leaving the image rejection ratio (IRR) mainly determined by the LO phase error that is a tradeoff with the LO-path power. Here, the targeted LO phase error is relaxed to ~4°, as letting the baseband circuitry (i.e., the complex pole load and 3-stage RC-CR PPF) to handle the IRR is more power efficient, as detailed in Sections III-E and III-F. The resultant voltages are shown in FIG. 5C.

Hybrid Filter Biquad Filter with IF Noise-Shaping

Figure 6A:
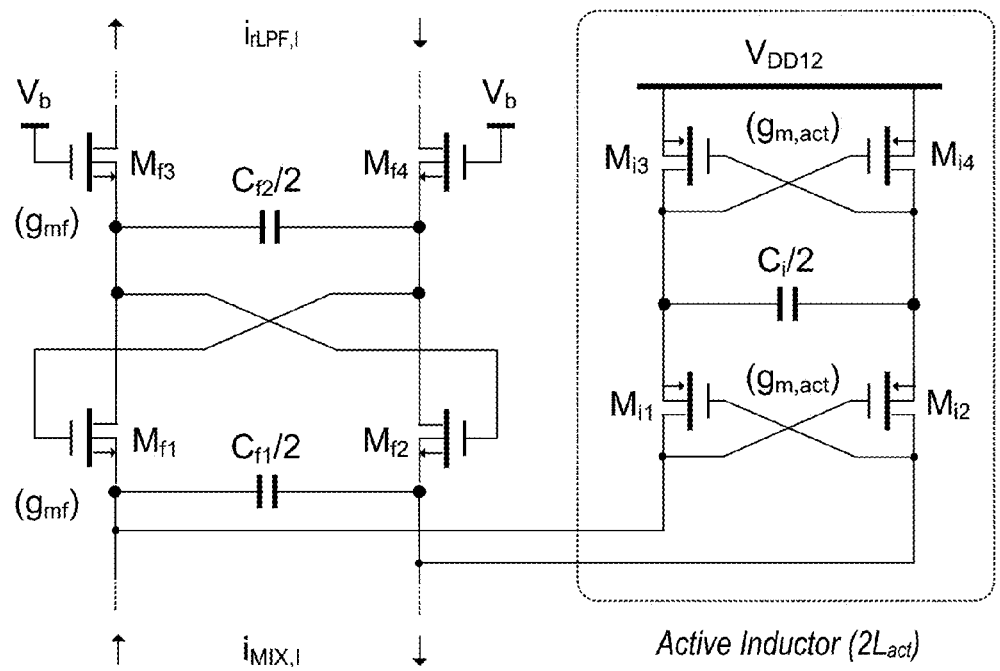
FIGS. 6A and 6B are schematic circuit diagrams showing IF noise-shaping biquad filter.
Figure 6B:
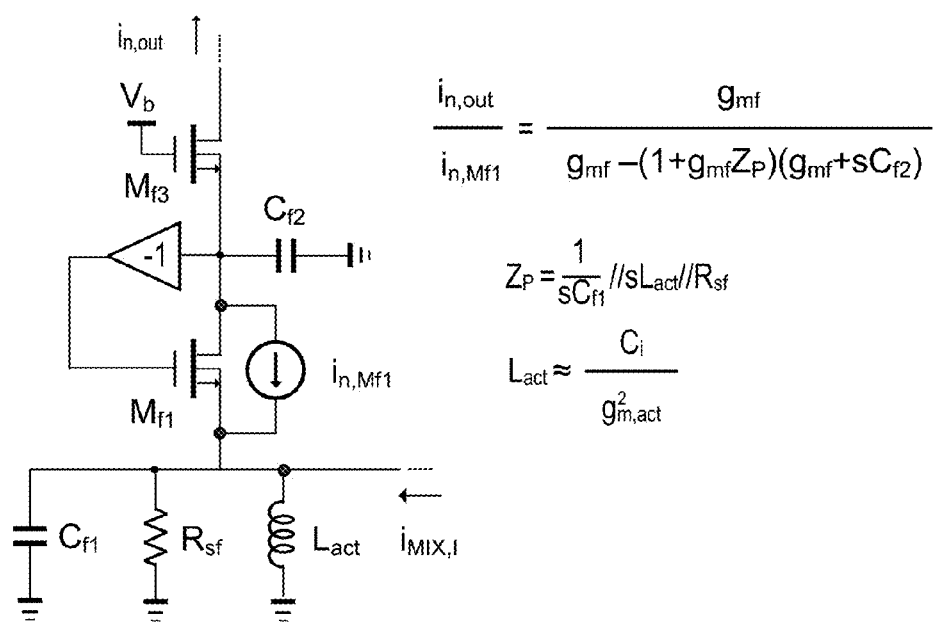

FIGS. 6A and 6B are schematic diagrams showing a hybrid filter first half current mode biquad filter with IF noise-shaping. FIG. 6A shows the biquad filter and FIG. 6B shows its small-signal equivalent circuit. The equivalent circuit in FIG. 6B shows the noise TF of $M_{f1}$. In FIG. 6A, a set of four transistors $M_{f1}$-$M_{f2}$, are connected in a parallel-series connection with transistors $M_{f1}$,$M_{f2}$ cross-connected at the series connection. Also depicted is the active inductor in which $M_{i1}$-$M_{i4}$ are series-parallel connected with each of $M_{i1}$-$M_{i4}$ cross-connected to their opposite series connections.

The current mode biquad filter shown in FIG. 6A is an excellent candidate for current-reuse with the balun LNA I/Q mixer for channel selection. This biquad filter only can generate a noise-shaping zero spanning from DC to ~2π 0.1$Q_B$ $\omega_{0B}$ MHz for $M_{f1}$-$M_{f2}$, where $Q_B$ and woo are the biquad filter's quality factor and −3 dB cutoff frequency, respectively. This noise shaping is hence ineffective for the disclosed low-IF design having a passband from $\omega_1$ to $\omega_2$ (=$\omega_{0B}$), where $\omega_1$>0.1$Q_B$ $\omega_{0B}$. To address this issue, an active inductor ($L_{act}$) is added at the sources of $M_{f1}$-$M_{f2}$. The $L_{act}C_{f1}$ resonator shifts the noise-shaping zero to the desired IF. If, as in the usual case, such an IF is in range of MHz, $L_{act}$ cannot be achieved by a passive inductor as it will be prohibitively large in size. The cross-diode connection between $M_{i1}$-$M_{i4}$ (all with $g_{m,act}$) emulate $L_{act} \approx C_i/g_{m,act}^2$. The small-signal equivalent circuit to calculate the noise TF of $i_{n,Mf1}/i_{n,out}$ is shown in FIG. 6B.

FIGS. 7A and 7B are graphical diagrams showing characteristics of the biquad filter. FIG. 7A shows equivalent impedance of ZP versus $\omega_{or}$. FIG. 7B shows simulated noise TF of $\frac{i_{n,out}}{i_{n,Mf1}}$ with and without $L_{act}$. An approximated impedance of $Z_P$ in different frequencies related to $\omega_{0r}$ is summarized in FIG. 7A, where $$\omega_{0r} = \frac{\omega_1 + \omega_2}{2}$$

is the resonant frequency of $L_{act}C_{f1}$ at IF. The simulated $i_{n,Mf1}/i_{n,out}$ is shown in FIG. 7B. At the low frequency range, $Z_P$ behaves inductively, degenerating further $i_{n,Mf1}$ when the frequency is increased. At the resonant frequency, $Z_P = R_{sf}$, where $R_{sf}$ is the parallel impedance of the active inductor's shunt resistance and double balanced mixer's output resistance. The latter is much higher when compared with $R_L$ thereby suppressing $i_{n,Mf1}$. At the high frequency range, $Z_P$ is more capacitive dominated by $C_{f1}$. It implies $i_{n,Mf1}$ can be leaked to the output via $C_{f1}$, penalizing the in-band noise. At even higher frequencies, the output noise decreases due to $C_{f2}$, being the same as its original form.

FIG. 8 is a graphical diagram showing simulated $NF_{Total}$ (at $V_{o,Ip}$ and $V_{o,In}$) with and without $L_{act}$. The signal TF can be derived from FIG. 8. Here $$R_L = \frac{1}{g_{mf}}, \quad L_{biq} = \frac{C_{f2}}{G_{mf}^2}$$

For an effective improvement of NF, $L_{act} \gg L_{biq}$ should be made. The simulated $NF_{total}$ at $V_{o,Ip}$ and $V_{o,IN}$ with and without the $L_{act}$ is shown FIG. 8, showing about ~0.1 dB improvement (reasonable contribution for a baseband circuit). Here $M_{f1}$-$M_{f4}$ use isolated P-well for bulk-source connection, avoiding the body effect while lowering their $V_T$.

Hybrid Filter 2$^{nd}$ Half—Complex Pole Load

Unlike most active mixers or the original balun LNA I/Q mixer that only use a RC load, the proposed "load" synthesizes a first order complex pole at the positive IF (+IF) for channel selection and image rejection. FIGS. 9A-C are diagrams showing a complex pole load, its small-signal equivalent circuit and pole plot. FIG. 9A is a schematic circuit diagram showing a complex pole load. FIG. 9B is a schematic circuit diagram showing the small-signal equivalent circuit of FIG. 9A. FIG. 9C is a diagram showing a pole plot of the circuit of FIGS. 9A and 9B.

FIG. 10 is a diagram showing simulated hybrid filter gain response. The circuit implementation and principle are shown in FIGS. 9A and 9B, respectively. The real part ($R_L$) is obtained from the diode-connected $M_L$, whereas the imaginary part ($g_{m,Mc}$) is from the I/Q cross-connected Mc. The entire hybrid filter, such as shown in FIG. 7A and in FIG. 9B, offers 5.2 dB IRR, and 12 dB (29 dB) adjacent (alternate) channel rejection as shown in FIG. 10 (the channel spacing is 5 MHz). Similar to $g_m$-C filters the center frequency is defined by $g_{m,Mc}R_L$. When sizing the −3 dB bandwidth, the output conductances of $M_C$ and $M_L$ should be taken into account.

Current-Mirror VGA and RC-CR PPF

FIGS. 11A and 11B are schematic circuit diagrams of the baseband circuitry. FIG. 11A is a schematic circuit diagram showing a VGA. FIG. 11B is a schematic circuit diagram showing a 3 stage RC CR PPF, inverter amplifier and 50Ω buffer. Outside the current-reuse path, $V_{o,I}$ and $V_{o,Q}$ are AC-coupled to a high swing current-mirror VGA formed with $M_L$ shown in FIG. 9A and a segmented $M_{VGA}$ as shown in FIGS. 11A and 11B, offering gain controls with a 6 dB step size. To enhance the gain precision, the bias current through $M_{VGA}$ is kept constant, so as its output impedance. With the gain switching of $M_{VGA}$, the input-referred noise of $M_{VGA}$ will vary. However, when the RF signal level is low the gain of the VGA should be high, rendering the gain switching not influencing the receiver's sensitivity. The VGA is responsible for compensating the gain loss (30 dB) of the 3-stage passive RC-CR PPF that provides robust image rejection of >50 dB (corner simulations). With the hybrid filter rejecting the out-band blockers the linearity of the VGA is further relaxed, so as its power budget (192 µW, limited by the noise and gain requirements).

A 3-stage RC-CR PPF can robustly meet the required IRR in the image band (i.e., the −IF), and cover the ratio of maximum to minimum signal frequencies. In the disclosed design, the expected IRR is 30 to 40 dB and the ratio of frequency of the image band is $f_{max}/f_{min}$ (=3). Counting the RC variations as large as ±25%, the conservative $\Delta f_{eff} = f_{max\_eff}/f_{min\_eff}$ should be close to 5:

$$\frac{\sigma(\text{Umage Out})}{\text{Desired Out}} = 0.25\sqrt{\left(\frac{\sigma_R}{R}\right)^2 \left(\frac{\sigma_C}{C}\right)^2} \quad (4)$$

Accordingly, the matching of the resistors ($\sigma_R$) and capacitors ($\sigma_C$) can be relaxed to 0.9% (2.93%) for 40 dB (30 dB) IRR with a 3σ yield. Here, ~150 kΩ resistors are chosen to ease the layout with a single capacitor size (470 fF), balancing the noise, area and IRR. The simulated worst IRR is 36 dB without LO mismatch, and still over 27 dB at a 4° LO phase error checked by 100× Monte Carlo simulations. Furthermore, if the 5 dB IRR offered by the complex pole load is added the minimum IRR of the IF chain should be 32 dB. The final stage before 50Ω output buffering is a self-biased inverter amplifier (power=144 µW), which embeds one more real pole for filtering.

FIG. 12 is a diagram showing simulated overall IF gain response. The simulated overall IF gain response is shown in FIG. 12, where the notches at DC offered by the AC-coupling network, and around the −IF offered by the 3-stage RC-CR PPF, are visible. The IRR is about 57 dB under an ideal 4-phase 25% LO for the image band from ($f_{LO}$-3, $f_{LO}$-1) MHz. (57 dB=52 dB (RC-CR PPF)+5 dB, as a complex pole load.)

VCO and Dividers and LO Buffers

To fully benefit the speed and low-$V_T$ advantages of fine line-width CMOS, the entire LO path is powered at a lower supply of 0.6 V to reduce the dynamic power. For additional testability, an on-chip VCO is integrated. It is optimized at ~10 GHz to save area and allows division by 4 for I/Q generation. The loss of its LC tank is compensated by complementary nmOS-PMOS negative transconductors.

FIGS. 13A-C are diagrams showing DIV1 and DIV2, and their timing diagrams. FIG. 13A is a schematic circuit diagram in block form showing divider circuits. FIG. 13 B is a schematic circuit diagram showing the divider circuits.

FIG. 13C is a diagram showing the timing diagrams of the circuits of FIGS. 13A and 13B.

The divider chain shown in FIG. 13A cascades two types of divide-by-2 circuits (DIV1 and DIV2) to generate the desired 4-phase 25% LO, from a 2-phase 50% output of the VCO. The two latches (D1 and D2) are employed to build DIV1 that can directly generate a 25% output from a 50% input, resulting in power savings due to less internal logic operation (i.e., AND gates) and load capacitances. Each latch consists of two sense devices, a regenerative loop and two pull up devices. For 25% input 25% output division, DIV2 is proposed that it can be directly interfaced with DIV1. The 25% output of DIV1 are combined by $M_{D1}$ to $M_{D4}$ to generate a 50% clock signal for D3 and D4.

For testing under an external $LO_{ext}$ source at 4.8 GHz, another set of D1 and D2 is adopted. The output of these two sets of clocks are combined by transmission gates and then selected. Although their transistor sizes can be reduced aggressively to save power, their drivability and robustness in process corners can be degraded. From simulations, the sizing can be properly optimized. The four buffers ($Buf_1$-$Buf_4$) serve to reshape the pulses from DIV2 and enhance the drivability. The timing diagram is shown in FIG. 13B.

FIGS. 14A-B are diagrams showing post layout simulations. FIG. 14 A is a graphical depiction showing a post-layout simulation of NF and gain versus LO's amplitude. FIG. 14B is a schematic circuit diagram showing a additional $C_{LO}$ generates the optimum LO's amplitude. Due to the very small $I_{BIAS}$ for the I/Q double balanced mixers, a LO amplitude of around 0.4 $V_{pp}$ is found to be more optimized in terms of NF and gain as simulated and shown in FIG. 14A. To gain benefits from it $C_{LO}$ is added to realize a capacitor divider with $C_{MIX,in}$ (input capacitance of the mixer) as shown in FIG. 14B. This act brings down the equivalent load ($C_{L,eq}$) of $Buf_1$-$Buf_4$ by ~33%.

Experimental Results

FIGS. 15A-C are photographic depictions of the receiver. FIG. 15A is a photomicrograph showing the receiver chip, tested under CoB and CQFP44 packaging. FIGS. 15B and C are depictions of circuit connections for the receiver chip of FIG. 15A. The ZigBee receiver was fabricated in 65 nm CMOS and optimized with dual supplies (1.2 V: balun LNA I/Q mixer+hybrid filter, 0.6 V: LO and baseband circuitries). The die area is 0.24 mm² (0.3 mm²) without (with) counting the LC-tank VCO.

FIGS. 16A-D are graphical diagrams showing measured profiles for the receiver of FIGS. 15A-C. FIG. 16A is a graphical diagram showing measured the input port voltage reflection coefficient ($S_{11}$), FIG. 16B is a graphical diagram showing measured wide band gain and NF, FIG. 16C is a graphical diagram showing a measured $IIP3_{out\text{-}band}$. FIG. 16D is a graphical diagram showing a measured low IF filtering profile. Since there is no frequency synthesizer integrated, the results in FIG. 16A-D were measured under $LO_{ext}$ for accuracy and data repeatability. $S_{11}$-BW (<−10 dB) is ~1.3 GHz for both chip-on-board (CoB) and CQFP-packaged tests, as shown in FIG. 16A, which proves its immunity to board parasitics and packaging variations. The gain (55 to 57 dB) and NF (8.3 to 11.3 dB) are also wideband consistent, as shown in FIG. 16B. The gain peak at around 2.4 to 2.5 GHz is from the passive pre-gain. Following a linearity test profile, two tones at [LO+12 MHz, LO+22 MHz] are applied, measuring an $IIP3_{out\text{-}band}$ of −6 dBm, as shown in FIG. 16C, at the maximum gain of 57 dB. This high IIP3 is due to the direct current mode filtering at the mixer's output before signal amplification. The asymmetric IF response, as shown in FIG. 16D shows 22 dB (43 dB) rejection at the adjacent (alternate) channel, and 36 dB IRR. The filtering rejection profile is around 80 dB/decade. The spurious free dynamic range (SFDR) is close to 60 dB, $$\text{SFDR}=2(P_{IIP3}+174\text{ dBm}-NF-10\log BW)/3-\text{SNR}_{min} \quad (5)$$

where $\text{SNR}_{min}$=4 dB is the minimum signal-to-noise ratio required by the application, and BW=2 MHz is the channel bandwidth.

The receiver was further tested at lower voltage supplies as summarized in Table I:

TABLE I

Key performances of the receiver at different supply voltages.

| Supply Voltage (V) | 0.6/1.2 | 0.6/1 | 0.5/1 |
|---|---|---|---|
| Power (mW) | 1.7 | 1.2 | 0.8 |
| Gain (dB) | 57 | 58 | 57.5 |
| IIP3$_{out\text{-}band}$ (dBm) | −6 | −4 | −8 |
| NF (dB) | 8.5 | 11.3 | 12 |
| IRR (dB) | 36 | 38 | 35 | to the specifications as shown in FIG. 17A. Porting it to the simulation results, it can be found that the corresponding VCO's output swing is 0.34 V$_{pp}$ and the total LO-path power is 1.7 mW (VCO+dividers+BUFs). Such an output swing is adequate to lock DIV1 as shown in its simulated sensitivity curve, as shown in FIG. 17B.

The chip summary and performance benchmarks are given in Table II, showing current-reuse architectures, a classical architecture with cascade of building blocks, and an ultra-low-voltage design. The results measured under a 10 GHz on-chip VCO are also included for completeness, but they are more sensitive to test uncertainties:

TABLE II

Performance summary and benchmark with the state-of-the-art.

| | This Disclosure | | JSSC'10 [7] | JSSC'10 [8] | JSSC'10 [23] | ISSCC'13 [5] |
|---|---|---|---|---|---|---|
| Application | ZigBee | | ZigBee | GPS | ZigBee/Bluetooth | Energy Harvesting |
| Architecture | Blixer + Hybrid-Filter + Passive RC-CR PPF | | LMV Cell + Complex Filter | QLMV Cell + Complex Filter | LNA + Mixer + Complex Filter | LNA + Mixer + Frequency-translated IF Filter |
| BB Filtering | 1 Biquad + 4 complex poles | | 3 complex poles | 2 complex poles | 3 complex poles | 2 real poles |
| External I/P Matching Components | zero | | 1 inductor, 1 capacitor | 1 passive balun | 1 inductor, 1 capacitor | 2 capacitors, 1 inductor |
| S$_{11}$ < −10 dB Bandwidth (MHz) | 1300 (2.25 to 3.55 GHz) | | <300 (2.3 to 2.6 GHz) | 100 (1.55 to 1.65 GHz) | >400 (<2.2 to 2.6 GHz) | >600 (<2 to 2.6 GHz) |
| Integrated VCO | No | Yes | Yes | Yes | No | Yes |
| Gain (dB) | 57 | 55 | 75 | 42.5 | 67 | 83 |
| Phase Noise (dBc/Hz) | NA | −115 @ 3.5 MHz | −116 @ 3.5 MHz | −110 @ 1 MHz | NA | −112.8 @ 1 MHz |
| NF (dB) | 8.5 | 9 | 9 | 6.5 | 16 | 6.1 |
| IIP3$_{out\text{-}band}$ (dBm) | −6 | −6 | −12.5 | N/A | −10.5 | −21.5 |
| IRR (dB) | 36 (worst of 5 chips) | 28 | 35 | 37 | 32 | N/A |
| SFDR (dB) | 60.3 | 60 | 55.5 | N/A | 53.6 | 51.6 |
| LO-to-RF Leak (dBm) | −61 | −61 | −60 | −75 | N/A | N/A |
| Power (mW) | 1.7 * | 2.7 | 3.6 | 6.2 (inc. ADC) | 20 | 1.6 |
| Active Area (mm$^2$) | 0.24 | 0.3 | 0.35 | 1.5 (inc. ADC) | 1.45 | 2.5 |
| Supply Voltage (V) | 0.6/1.2 | | 1.2 | 1 | 0.6 | 0.3 |
| Technology | 65 nm CMOS | | 90 nm CMOS | 130 nm CMOS | 65 nm CMOS | 65 nm CMOS |

* Breakdown: 1 mW: Blixer + hybrid filter + BB circuitry, 0 7 mW: DIV1 + LO Buffers Only the NF degrades more noticeably, the IIP3, IRR and BB gain are almost secured. The better IIP3 for 0.6 V/1-V operation is mainly due to the narrower −3 dB bandwidth of the hybrid filter. For the 0.5 V/1-V operation, the degradation of IIP3$_{out\text{-}band}$ is likely due to the distortion generated by A$_{GB}$. Both cases draw very low power down to 0.8 mW, being comparable with other ULP designs.

The LC-tank VCO was tested separately. FIGS. 17A and 17B are graphical diagrams showing noise and input swing of the LC-tank VCO. FIG. 17A is a graphical diagram showing measured phase noise has enough margin to the specifications, showing that from simulations it is a tradeoff with the power budget according to the VCO's output swing. FIG. 17B is a graphical diagram showing a simulated sensitivity curve of DIV1 showing its small input voltage requirement at ~10 GHz. The power budget of the LC-tank VCO is related with its output swing and is a tradeoff with the phase noise, which measures 114 dBc/Hz at 3.5 MHz that has an enough margin The degraded NF and IRR are mainly due to the phase noise of the free-running VCO. In both cases, this work succeeds in advancing the IIP3$_{out\text{-}band}$, power and area efficiencies, while achieving a wideband input port voltage reflection coefficient (S$_{11}$) with zero external components. As compared with similar systems, the presently disclosed technology achieves 8× less area and 15.5 dBm higher IIP3, together with stronger baseband channel selectivity.

CONCLUSION

A number of ULP circuits and optimization techniques have been applied to the design of a 2.4 GHz ZigBee receiver in 65 nm CMOS. The extensive-current-reuse RF-to-BB path is based on a balun LNA I/Q mixer+hybrid filter topology, which improves not only the power and area efficiencies, but also the out-band linearity due to more current-domain signal processing. Specifically, the balun LNA I/Q mixer features: 1) a low-Q input matching network realizing wideband input port voltage reflection coefficient ($S_{11}$) and robust passive pre-gain, 2) a balun LNA with active-gain boosting and partial-noise canceling improving the gain and NF, 3) I/Q double balanced mixers driven by a 4-phase 25% LO inherently offering output balancing. For the hybrid filter, an IF noise-shaping biquad filter together with a complex pole load synthesize 3rd-order channel selection and 1st-order image rejection. All of them render current-reuse topologies with great potential for developing ULP radios in advanced CMOS processes.

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A unified balun low noise amplifier (LNA) and I/Q mixer comprising:
    a passive/active gain-boosted balun-LNA-I/Q-mixer (blixer);
    an IF-noise-shaping transistorized current-mode lowpass filter sharing a common power supply with the blixer, thereby drawing a single bias current;
    a complex-pole load providing image rejection and channel selection, and current-to-voltage conversion;
    a multiplexer circuit providing a multiplexed output for providing separate mixing signals for I and Q channel outputs; and
    a 4-phase internal local oscillator (LO) selectively switchable to provide an internal test signal to the multiplexer, whereby combining the LO with an external local oscillator signal permits testing in different combinations of the internal LO and the external local oscillator signals.

2. The unified balun LNA and I/Q mixer of claim 1, further comprising:
    the LNA providing separate I and Q channel outputs;
    a local oscillator multiplexer providing a multiplexed output for providing separate mixing signals for the I and Q channel outputs; and
    the mixer having separate mixing circuits for separately mixing the I and Q channel outputs with the separate mixing signals from the multiplexed output and providing balanced I and Q mixed outputs.

3. A unified balun low noise amplifier (LNA) and I/Q mixer comprising:
    a passive/active gain-boosted balun-LNA-I/Q-mixer (blixer);
    an IF-noise-shaping transistorized current-mode lowpass filter sharing a common power supply with the blixer, thereby drawing a single bias current;
    a complex-pole load providing image rejection and channel selection;
    the LNA providing separate I and Q channel outputs;
    a local oscillator multiplexer providing a multiplexed output for providing separate mixing signals for the I and Q channel outputs;
    the mixer having separate mixing circuits for separately mixing the I and Q channel outputs with the separate mixing signals from the multiplexed output and providing balanced I and Q mixed outputs; and
    a 4-phase internal local oscillator (LO) selectively switchable to provide an internal test signal to the local oscillator multiplexer, whereby combining the LO with an external local oscillator signal permits testing in different combinations of the internal LO and the external local oscillator signal.

4. The unified balun LNA and I/Q mixer of claim 2, further comprising:
    a hybrid filter having a current input and a current output and receiving the I and Q mixed outputs and providing a complex pole output as separate I and Q complex pole output signals.

5. The unified balun LNA and I/Q mixer of claim 3, further comprising:
    the LNA providing separate I and Q channel outputs;
    a four-phase local oscillator providing a multiplexed output for providing separate mixing signals for the I and Q channel outputs; and
    the mixer having separate mixing circuits for separately mixing the I and Q channel outputs with the separate mixing signals from the multiplexed output and providing balanced I and Q mixed outputs.

6. The unified balun LNA and I/Q mixer of claim 1, further comprising:
    an output amplifier providing buffering at a predetermined output impedance.

7. A unified balun low noise amplifier (LNA) and I/Q mixer comprising:
    a passive/active gain-boosted balun-LNA-IQ-mixer (blixer);
    an IF-noise-shaping transistorized current-mode lowpass filter sharing a common power supply with the blixer, thereby drawing a single bias current;
    a complex-pole load providing image rejection and channel selection;
    the LNA providing separate I and Q channel outputs;
    a local oscillator multiplexer providing a multiplexed output for providing separate mixing signals for the I and Q channel outputs;
    the mixer having separate mixing circuits for separately mixing the I and Q channel outputs with the separate mixing signals from the multiplexed output and providing balanced I and Q mixed outputs;
    the separate mixing circuits using the separate mixing signals from the multiplexed output and providing balanced I and Q mixed outputs results in output balancing; and
    an AC-coupled gain boost stage controls a noise figure (NF) of the circuit, thereby providing decoupling of the NF while providing the output balancing.

8. A unified balun low noise amplifier (LNA) and I/Q mixer comprising:
    a passive/active gain-boosted balun-LNA-I/Q-mixer (blixer);
    an IF-noise-shaping transistorized current-mode lowpass filter sharing a common power supply with the blixer, thereby drawing a single bias current;
    a complex-pole load providing image rejection and channel selection; and
    the LNA, I/Q mixer and IF-noise-shaping transistorized current-mode lowpass filter sharing common chip architecture having a current reuse path, the common chip architecture merging the balun with the IF-noise-shaping transistorized current-mode lowpass filter so as to allow transfer of received signals from the balun to the LNA in a common current domain, thereby avoiding explicit voltage-to-current and current-to-voltage interfaces, resulting in reduced power consumption.

9. The unified balun LNA and I/Q mixer of claim 8, further comprising:
    the LNA, I/Q mixer and the hybrid filter sharing common chip architecture having a current reuse path, thereby allowing current re-use between the hybrid filter and the low noise amplifier.

10. The unified balun LNA and I/Q mixer of claim 9, further comprising:

the common chip architecture merging the balun with the hybrid filter so as to allow transfer of received signals from the balun to the LNA in a common current domain, thereby avoiding explicit voltage-to-current and current-to-voltage interfaces, resulting in reduced power consumption.

11. The unified balun LNA and I/Q mixer of claim 8, further comprising:

the complex-pole load receiving the separate I and Q complex pole output signals and providing an amplified baseband output signal as an output of the unified balun LNA and I/Q mixer.

12. A method of converting an unbalanced signal to a quadrature signal having a balanced output, the method comprising:

receiving the unbalanced signal;
using a low noise amplifier (LNA) to provide a quadrature LNA output signal;
providing a local oscillator (LO) signal and multiplexing the LO signal for separately mixing as quadrature LO signals;
mixing the quadrature LNA output signal with the quadrature LO signals to provide mixed quadrature signals;
applying biquad filtration to the mixed quadrature signals;
applying complex pole filtering to the mixed quadrature signals;
providing a buffered output;
providing a first local oscillator signal;
using a local oscillator multiplexer to provide the LO signal with separate mixing signals for the I and Q channel quadrature outputs; and
using a 4-phase internal local oscillator to provide an internal test signal to the local oscillator multiplexer, whereby combining the LO with the first local oscillator signal permits testing in different combinations of the internal LO and the first local oscillator signal.

13. A method of converting an unbalanced signal to a quadrature signal having a balanced output, the method comprising:

receiving the unbalanced signal;
using a low noise amplifier (LNA) to provide a quadrature LNA output signal;
providing a local oscillator (LO) signal and multiplexing the LO signal for separately mixing as quadrature LO signals;
mixing the quadrature LNA output signal with the quadrature LO signals to provide mixed quadrature signals;
applying the applying biquad filtration and the complex pole filtering to the mixed quadrature signals to provide a hybrid filter function;
applying complex pole filtering to the mixed quadrature signals;
providing a buffered output;
using a common chip architecture for the mixing of the quadrature LNA output signal, the biquad filtration and the complex pole filtering; and
using the common chip architecture to provide a current reuse path, the common chip architecture merging a balun function with the hybrid filter function so as to allow transfer of received signals in a common current domain, thereby avoiding explicit voltage-to-current and current-to-voltage interfaces, resulting in reduced power consumption.

* * * * *